(12) United States Patent
Nysen et al.

(10) Patent No.: US 6,208,062 B1
(45) Date of Patent: Mar. 27, 2001

(54) SURFACE ACOUSTIC WAVE TRANSPONDER CONFIGURATION

(75) Inventors: Paul A. Nysen, Sunnyvale; Halvor Skeie, San Jose, both of CA (US)

(73) Assignee: X-Cyte, Inc., San Jose, CA (US)

( * ) Notice: Subject to any disclaimer, the term of this patent is extended or adjusted under 35 U.S.C. 154(b) by 0 days.

(21) Appl. No.: 09/248,024

(22) Filed: Feb. 10, 1999

Related U.S. Application Data

(63) Continuation-in-part of application No. 08/914,284, filed on Aug. 18, 1994, now Pat. No. 5,986,382.

(51) Int. Cl.[7] .................................................. H03H 9/42
(52) U.S. Cl. ........................ 310/313 R; 333/152; 333/153
(58) Field of Search ........................ 310/313 R; 333/152, 333/153, 156, 138

(56) References Cited

U.S. PATENT DOCUMENTS

| | | | |
|---|---|---|---|
| 2,817,012 | 12/1957 | Kendall | 342/42 |
| 3,025,524 | 3/1962 | Thies | 343/823 |
| 3,209,350 | 9/1965 | Davis et al. | 340/825.34 |
| 3,273,146 | 9/1966 | Hurwitz | 342/51 |
| 3,513,470 | 5/1970 | Rabow | 342/51 |
| 3,521,280 | 7/1970 | Janco et al. | 342/44 |
| 3,582,540 * | 6/1971 | Adler et al. | 178/5.4 R |
| 3,600,710 | 8/1971 | Adler | 333/72 |
| 3,665,480 | 5/1972 | Fassett | 343/754 |
| 3,689,929 | 9/1972 | Moody | 343/802 |
| 3,706,094 | 12/1972 | Cole et al. | 343/6.5 SS |
| 3,737,911 | 6/1973 | Sakuragi et al. | 343/65 SS |
| 3,755,803 | 8/1973 | Cole et al. | 340/280 |

(List continued on next page.)

FOREIGN PATENT DOCUMENTS

| | | | |
|---|---|---|---|
| 6661181 | 1/1980 | (AU) | G01K/11/22 |
| 3400184 | 10/1984 | (AU) | H04B/1/59 |
| 2189788 | 9/1987 | (AU) | G07C/5/00 |
| 8900470 | 11/1989 | (AU) | H03H/9/145 |
| 9000043 | 2/1990 | (AU) | H04B/1/59 |
| 1228911 | 11/1987 | (CA) | G01S/9/145 |
| 1228912 | 11/1987 | (CA) | G01S/13/80 |
| 2521290 | 5/1975 | (DE) | H03H/9/145 |
| 2524571 | 6/1975 | (DE) | H04B/7/15 |
| 2604105 | 2/1976 | (DE) | H03H/9/00 |
| 2813753 | 3/1978 | (DE) | G01S/9/56 |
| 0089617 | 3/1983 | (DE) | H03H/9/1145 |
| 3438051 | 10/1984 | (DE) | G01S/13/74 |
| 0513007 | 11/1990 | (EP) | H03H/9/02 |
| 1298381 | 2/1969 | (GB) | H04B/7/00 |
| 1413486 | 12/1972 | (GB) | H03B/5/32 |
| 2165411 | 10/1984 | (GB) | H03H/9/42 |
| 2165423 | 10/1984 | (GB) | H04B/1/59 |
| 2165425 | 10/1984 | (GB) | H03B/23/00 |
| 2142475 | 1/1985 | (GB) | H04B/1/59 |
| WO02485 | 11/1980 | (JP) | H03H/9/145 |
| 56-122215 | 9/1981 | (JP) | H03H/9/145 |
| 56-153817 | 11/1981 | (JP) | H03H/9/145 |
| 847909 | 6/1985 | (ZA) . | |
| 847910 | 6/1985 | (ZA) . | |

Primary Examiner—Thomas M. Dougherty
(74) Attorney, Agent, or Firm—Milde, Hoffberg & Macklin, LLP

(57) ABSTRACT

An acoustic wave identification transponder device, having a substrate, an electroacoustic transducer generating an acoustic wave in said substrate and a set of encoding elements disposed in a path of the acoustic wave for modifying the acoustic wave, having elements which reflect portions of the acoustic wave having a component orthogonal to the incident wave. The reflectors may be, for example, trackchangers or reflective arrays compressors (RAC). The wave may be phase-amplitude modulated for increased efficiency expressed in bits per tap. Such phase amplitude modulation is preferably imposed by partial beam width phase delay elements disposed within an acoustic beam path.

24 Claims, 23 Drawing Sheets

U.S. PATENT DOCUMENTS

| | | | | |
|---|---|---|---|---|
| 3,801,935 | | 4/1974 | Mitchell | 333/72 |
| 3,810,257 | | 5/1974 | Jones et al. | 333/30 R |
| 3,845,420 | | 10/1974 | Holland et al. | 333/30 R |
| 3,845,490 | | 10/1974 | Manwarren et al. | 343/821 |
| 3,869,682 | | 3/1975 | Heeks et al. | 332/11 R |
| 3,870,994 | | 3/1975 | McCormick et al. | 343/65 R |
| 3,878,528 | | 4/1975 | Majeau | 343/65 SS |
| 3,898,592 | | 8/1975 | Solie | 333/72 |
| 3,909,838 | | 9/1975 | Beyerlein | 357/70 |
| 3,931,597 | | 1/1976 | Cho et al. | 333/30 R |
| 3,936,774 | | 2/1976 | Mellon et al. | 333/30 R |
| 3,961,290 | | 6/1976 | Moore | 333/30 R |
| 3,981,011 | | 9/1976 | Bell, III | 343/65 LC |
| 4,003,073 | | 1/1977 | Helda et al. | 357/70 |
| 4,023,167 | | 5/1977 | Wahlstrom | 343/65 SS |
| 4,028,649 | * | 6/1977 | Komatsu et al. | 310/313 B |
| 4,044,355 | | 8/1977 | Edvardsson | 343/14 |
| 4,058,217 | | 11/1977 | Vaughan et al. | 209/74 M |
| 4,059,831 | | 11/1977 | Epstein | 343/6.8 R |
| 4,063,226 | * | 12/1977 | Kozma et al. | 365/125 |
| 4,069,472 | | 1/1978 | Kamata et al. | 340/146.3 K |
| 4,072,915 | | 2/1978 | Mitchell | 333/72 |
| 4,096,477 | | 6/1978 | Epstein et al. | 343/65 SS |
| 4,106,020 | | 8/1978 | Johnson | 343/14 |
| 4,110,653 | | 8/1978 | Hartemann | 310/313 |
| 4,138,681 | | 2/1979 | Davidson et al. | 343/702 |
| 4,141,712 | | 2/1979 | Rogers | 65/36 |
| 4,143,340 | | 3/1979 | Hunsinger | 333/151 |
| 4,151,525 | | 4/1979 | Strauch et al. | 343/65 R |
| 4,155,056 | | 5/1979 | Cross et al. | 333/195 |
| 4,166,258 | | 8/1979 | Tseng | 333/195 |
| 4,180,815 | | 12/1979 | Hill | 343/65 R |
| 4,201,964 | | 5/1980 | Noro et al. | 333/151 |
| 4,213,104 | | 7/1980 | Cullen et al. | 333/150 |
| 4,217,564 | | 8/1980 | Autran | 33/152 |
| 4,234,666 | | 11/1980 | Gursky | 428/573 |
| 4,241,352 | | 12/1980 | Alspaugh et al. | 343/700 MS |
| 4,242,671 | | 12/1980 | Plows | 340/572 |
| 4,242,685 | | 12/1980 | Sanford | 343/770 |
| 4,259,673 | | 3/1981 | Guretzky | 343/825 |
| 4,260,988 | | 4/1981 | Yanagisawa et al. | 343/700 MS |
| 4,263,571 | | 4/1981 | Kinoshita et al. | 333/194 |
| 4,263,595 | | 4/1981 | Vogel | 343/65 SS |
| 4,267,534 | | 5/1981 | Tanski | 333/153 |
| 4,288,343 | | 9/1981 | Louderback | 252/408 |
| 4,288,689 | | 9/1981 | Lemelson et al. | 235/435 |
| 4,297,701 | | 10/1981 | Henriques | 343/65 LC |
| 4,307,356 | | 12/1981 | Arai | 333/194 |
| 4,320,402 | | 3/1982 | Bowen | 343/700 MS |
| 4,330,790 | | 5/1982 | Burns | 357/70 |
| 4,331,740 | | 5/1982 | Burns | 428/572 |
| 4,339,753 | | 7/1982 | Mawhinney | 343/65 SS |
| 4,353,043 | * | 10/1982 | Gunton | 310/313 D |
| 4,370,030 | * | 1/1983 | Sprague | 350/358 |
| 4,388,524 | | 6/1983 | Walton | 235/380 |
| 4,400,702 | | 8/1983 | Tanaka | 343/790 |
| 4,410,823 | | 10/1983 | Miller et al. | 310/313 D |
| 4,422,055 | | 12/1983 | Cullen et al. | 333/151 |
| 4,423,392 | | 12/1983 | Wolfson | 333/116 |
| 4,434,383 | | 2/1984 | Cho et al. | 310/313 R |
| 4,462,011 | | 7/1984 | Ward | 333/154 |
| 4,477,813 | | 10/1984 | Weiss | 343/700 MS |
| 4,480,150 | | 10/1984 | Jones et al. | 174/52 FP |
| 4,484,160 | | 11/1984 | Riha | 333/195 |
| 4,494,031 | | 1/1985 | Barnes et al. | 310/313 B |
| 4,554,549 | | 11/1985 | Fassett et al. | 343/700 MS |
| 4,589,422 | | 5/1986 | James et al. | 128/804 |
| 4,604,623 | | 8/1986 | Skeie | 343/6.8 R |
| 4,605,929 | | 8/1986 | Skeie | 343/6.8 R |
| 4,620,191 | | 10/1986 | Skeie | 342/51 |
| 4,623,890 | | 11/1986 | Nysen | 342/44 |
| 4,625,184 | | 11/1986 | Niitsuma et al. | 333/150 |
| 4,625,207 | | 11/1986 | Skeie | 342/51 |
| 4,625,208 | | 11/1986 | Skeie et al. | 342/51 |
| 4,642,640 | | 2/1987 | Woolsey et al. | 342/42 |
| 4,644,384 | | 2/1987 | Charoensakvirochana | 357/74 |
| 4,646,326 | * | 2/1987 | Backof et al. | 375/39 |
| 4,672,418 | | 6/1987 | Moran et al. | 357/70 |
| 4,699,682 | | 10/1987 | Takishima | 156/292 |
| 4,703,327 | | 10/1987 | Rossetti et al. | 342/44 |
| 4,706,105 | | 11/1987 | Masuda et al. | 357/74 |
| 4,724,443 | | 2/1988 | Nysen | 343/700 MS |
| 4,725,841 | | 2/1988 | Nysen et al. | 342/44 |
| 4,734,698 | | 3/1988 | Nysen et al. | 342/44 |
| 4,737,789 | | 4/1988 | Nysen | 342/51 |
| 4,737,790 | | 4/1988 | Skeie et al. | 342/51 |
| 4,739,328 | | 4/1988 | Koelle et al. | 342/44 |
| 4,745,401 | | 5/1988 | Montean | 340/572 |
| 4,748,364 | * | 5/1988 | Mitsutsuka | 310/313 D |
| 4,782,345 | | 11/1988 | Landt | 343/727 |
| 4,786,907 | | 11/1988 | Koelle | 342/51 |
| 4,800,392 | | 1/1989 | Garay et al. | 343/700 MS |
| 4,816,839 | | 3/1989 | Landt | 340/795 |
| 4,845,397 | | 7/1989 | Herrick et al. | 310/348 |
| 4,853,705 | | 8/1989 | Landt | 343/803 |
| 4,864,158 | | 9/1989 | Koelle et al. | 307/231 |
| 4,888,591 | | 12/1989 | Landt et al. | 342/44 |
| 4,912,471 | | 3/1990 | Tyburski et al. | 342/42 |
| 4,931,664 | | 6/1990 | Knoll | 307/10.3 |
| 4,933,588 | | 6/1990 | Greer | 310/313 D |
| 4,951,057 | | 8/1990 | Nagel | 342/51 |
| 4,999,636 | | 3/1991 | Landt et al. | 342/90 |
| 5,019,815 | | 5/1991 | Lemelson et al. | 340/933 |
| 5,027,107 | | 6/1991 | Matsuno et al. | 340/572 |
| 5,030,807 | | 7/1991 | Landt et al. | 235/375 |
| 5,055,659 | | 10/1991 | Hendrick et al. | 235/439 |
| 5,095,240 | | 3/1992 | Nysen et al. | 310/313 R |
| 5,144,313 | | 9/1992 | Kirknes | 342/44 |
| 5,182,570 | | 1/1993 | Nysen et al. | 343/795 |
| 5,483,369 | * | 1/1996 | Darcie et al. | 310/313 R |
| 5,654,693 | | 8/1997 | Cocita | 340/572 |
| 5,986,382 | * | 11/1999 | Nysen | 310/313 D |
| 6,047,306 | * | 4/2000 | Hikita et al. | 708/815 |

* cited by examiner

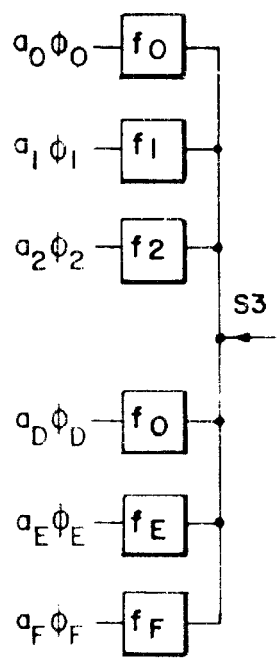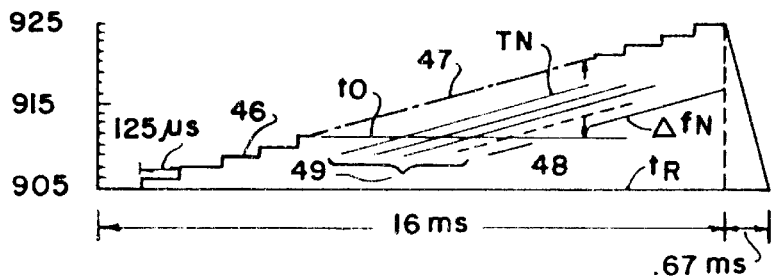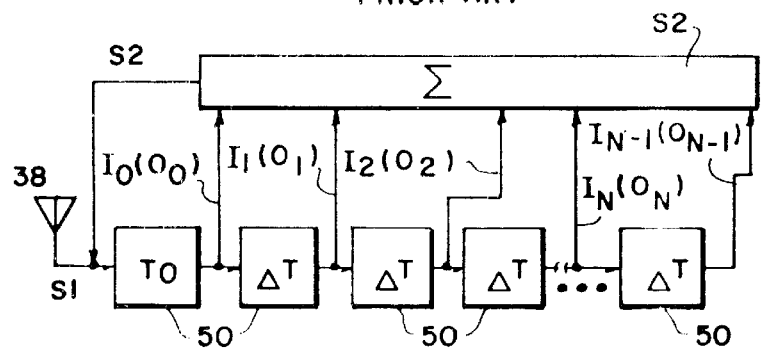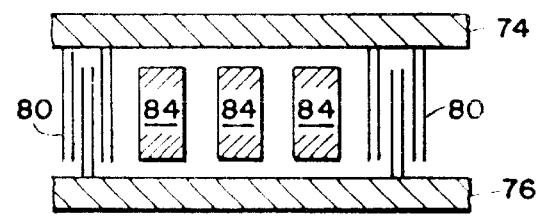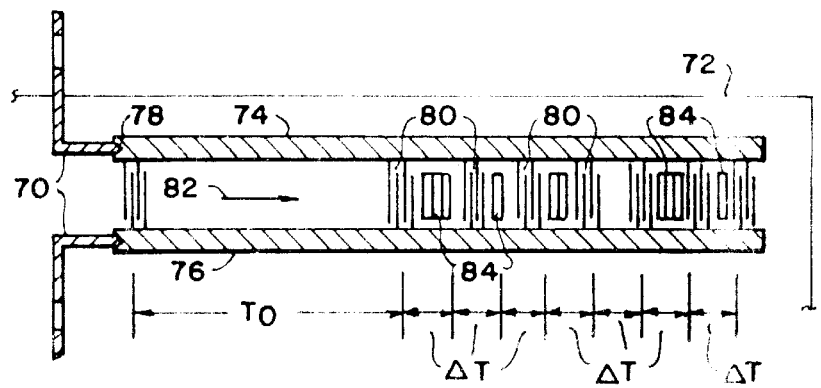

FIG.9A
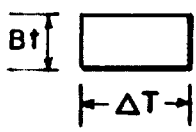
FIG.9B
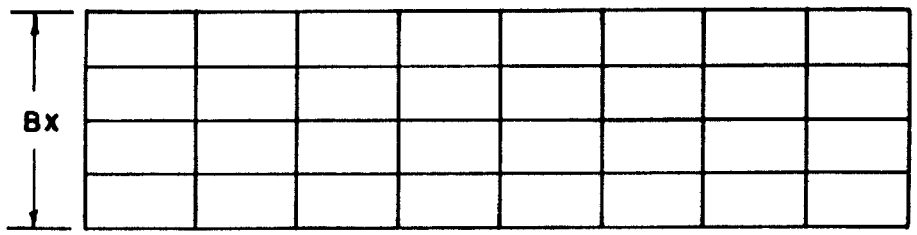
INFORMATION CELL DISTRIBUTED OVER TIME AND FREQUENCY
FIG.9C
INFORMATION CELLS DISTRIBUTED OVER TIME ONLY
FIG.10A
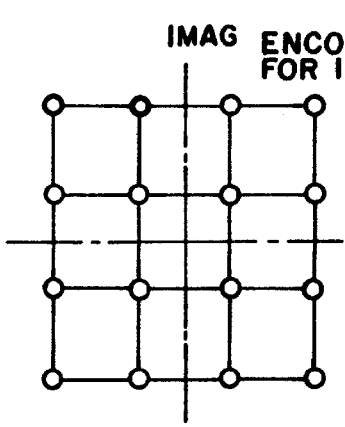
QAM (16) ENCODING
RECTANGULAR MODULATION
FIG.10B
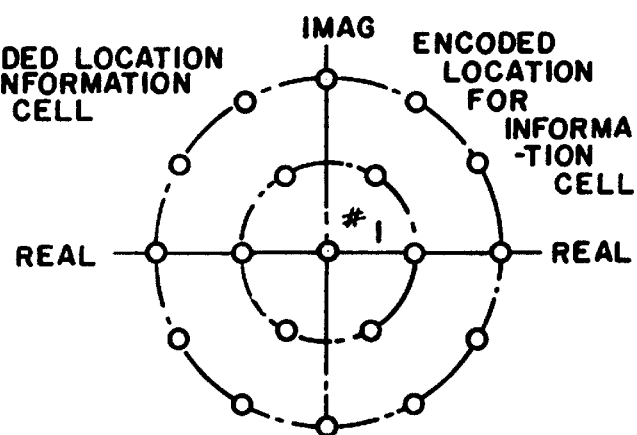
1 CELL NOT USED
QAM (18) ENCODING
POLAR MODULATION
(BETTER SUITED SAW APPLICATION)

BEAM PATTERN COVERAGE USING PATCH LIKE ANTENNA (PROJECTION VIEW)

POLARIZATION AXES
POLARIZATION COVERAGE

SPATIAL DISCRIMINA-TION MULTI-READ POINTS
SPATIAL COVERAGE

R = READERS

RF PROCESSING
PULSE
T
1/T

CHIRP

CHIRP IMPULSE (AFTER WEIGHTING APPLIED)
T $fm = Tr$
$t_{SWEEP}$ = SWEEP TIME
$1/t_{SWEEP}$ = NOISE BANDWIDTH OF DETECTOR

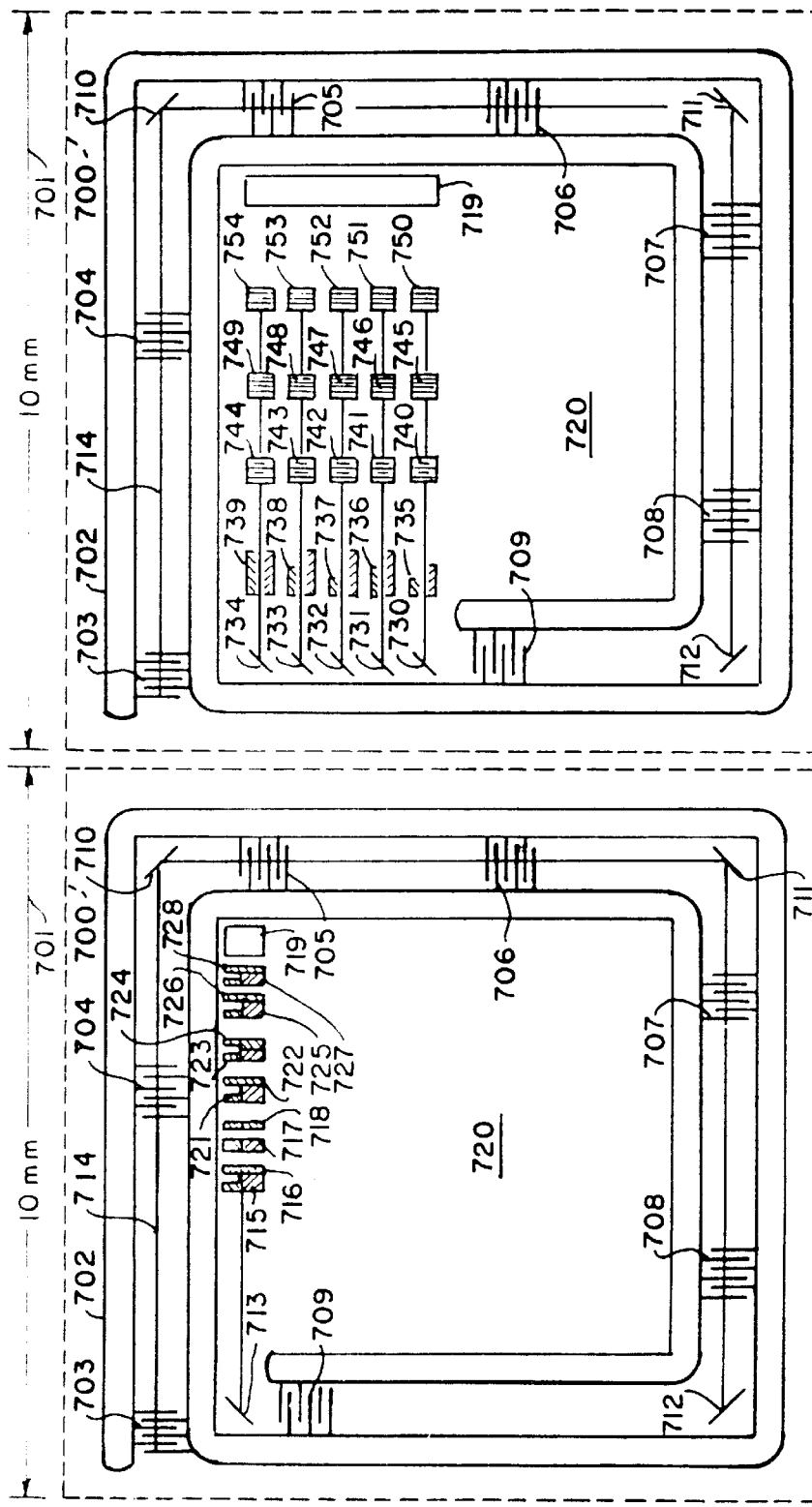

Calculation of element reflection and resultant loss per tap (excluding transducer loss) for 16 tap RAC. (8 taps on each side of transducers)

Parameters: top = prop. loss between taps (200ns delay)
rsp0 = refl. coeff. of 1st tap (one RAC element)
rl0 = prop. loss of first tap (1 µs delay)(dB)

$$top := 0.977 \qquad rp_0 = 0.04 \qquad rl_0 := 1.0 \qquad rsp_0 := \sqrt{rp_0}$$

$$i := 1..7 \qquad rp_i := \frac{rp_{i-1}}{1-rp_{i-1}} \cdot \frac{1}{top} \qquad rl_i := (1-rp_i) \cdot top \cdot \frac{rp_i}{rp_{i-1}} \qquad rsp_i := \sqrt{rp_i}$$

$$tloss_i := 20 \cdot \log(rl_i \cdot rp_0) - 1.0 \qquad tloss_0 := 20 \cdot \log(rp_0) - 1.0$$

$$rsp = \begin{bmatrix} 0.2 \\ 0.207 \\ 0.214 \\ 0.221 \\ 0.229 \\ 0.238 \\ 0.248 \\ 0.259 \end{bmatrix} \qquad rl = \begin{bmatrix} 1 \\ 0.997 \\ 0.997 \\ 0.997 \\ 0.996 \\ 0.996 \\ 0.995 \\ 0.994 \end{bmatrix} \qquad tloss = \begin{bmatrix} -28.959 \\ -28.983 \\ -28.986 \\ -28.989 \\ -28.993 \\ -28.998 \\ -29.004 \\ -29.011 \end{bmatrix}$$

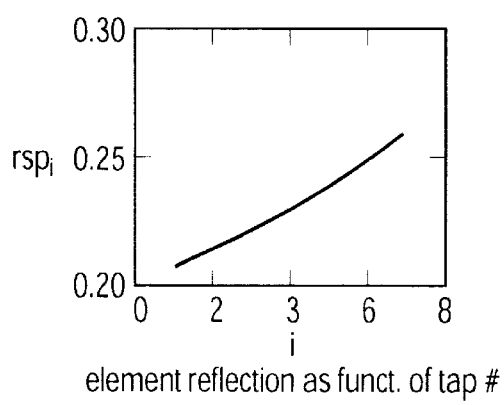

element reflection as funct. of tap #

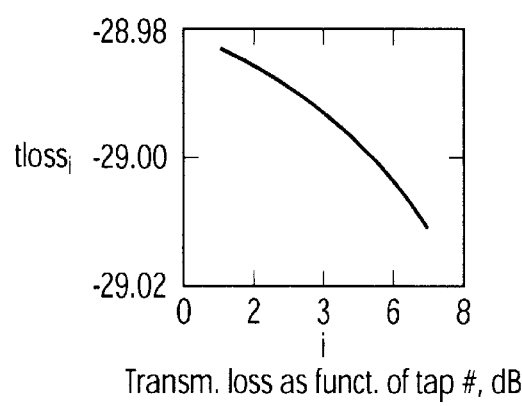

Transm. loss as funct. of tap #, dB

*Fig. 22*

Calculation of element reflection and resultant loss per tap (excluding transducer loss) for 16 tap RAC. (8 taps on each side of transducers)

Parameters: top = prop. loss between taps (200ns delay)
rsp0 = refl. coeff. of 1st tap (one RAC element)
rl0 = prop. loss of first tap (1 μs delay)(dB)

$\text{top} := 0.977 \qquad rp_0 = 0.0625 \qquad rl_0 := 1.0 \qquad rsp_0 := \sqrt{rp_0}$ $i := 1..7 \qquad rp_i := \dfrac{rp_{i-1}}{1 - rp_{i-1}} \cdot \dfrac{1}{\text{top}} \qquad rl_i := (1 - rp_i) \cdot \text{top} \cdot \dfrac{rp_i}{rp_{i-1}} \qquad rsp_i := \sqrt{rp_i}$ $tloss_i := 20 \cdot \log(rl_i \cdot rp_0) - 1.0 \qquad tloss_0 := 20 \cdot \log(rp_0) - 1.0$ $rsp = \begin{bmatrix} 0.25 \\ 0.261 \\ 0.274 \\ 0.288 \\ 0.304 \\ 0.323 \\ 0.345 \\ 0.372 \end{bmatrix} \qquad rl = \begin{bmatrix} 1 \\ 0.994 \\ 0.993 \\ 0.991 \\ 0.989 \\ 0.987 \\ 0.983 \\ 0.978 \end{bmatrix} \qquad tloss = \begin{bmatrix} -25.082 \\ -25.136 \\ -25.145 \\ -25.158 \\ -25.174 \\ -25.197 \\ -25.228 \\ -25.275 \end{bmatrix}$

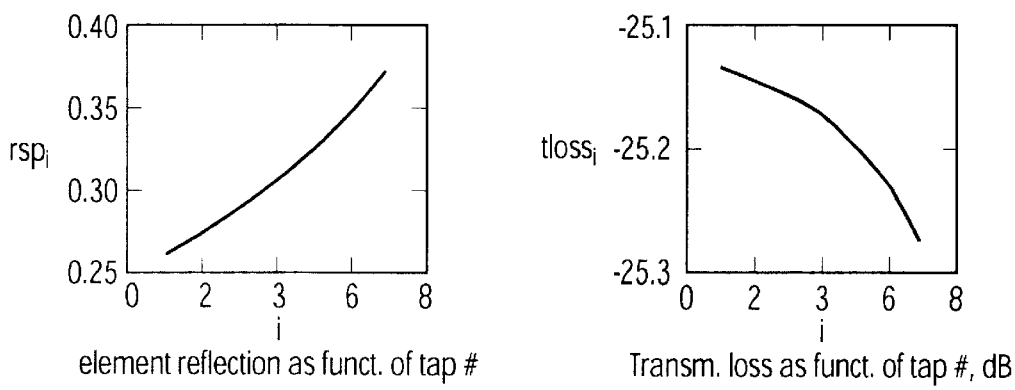

element reflection as funct. of tap #     Transm. loss as funct. of tap #, dB

*Fig. 23*

QAM-64

Phase Splitting

| $\frac{\pi}{2}$ | + | + | − | − |
|---|---|---|---|---|
| $\frac{\pi}{4}$ | + | − | + | − |
| result | ↗↘ 3510 | ↗↗ 3511 | ↗↘ 3512 | ↗↗ 3513 |

SURFACE ACOUSTIC WAVE TRANSPONDER CONFIGURATION

RELATED APPLICATIONS

The present application is a Continuation-In-Part of U.S. patent application Ser. No. 08/914,284 filed Aug. 18, 1997, now U.S. Pat. No. 5,986,382, the entirety of which is expressly incorporated herein by reference.

FIELD OF THE INVENTION

The present invention relates to new configuration of a surface acoustic wave transponder, and more particularly to a method and apparatus of improving the spatial and layout efficiency of surface acoustic wave encoded transponder having a folded acoustic path reducing a size of the otherwise required substrate.

BACKGROUND OF THE INVENTION

A known radio frequency passive acoustic transponder system produces individualized responses to an interrogation signal. The code space for these devices may be, for example, $2^{16}$ codes, or more, allowing a large number of transponders to be produced without code reuse. These devices provide a piezoelectric substrate on which an aluminum pattern is formed, for example by a typical microphotolithography process, with a minimum feature size of, for example, one micron.

These codes are imposed upon a received signal by signal transforming elements formed on the substrate. Typically, for each encoded symbol, a separate transforming element is formed. In order to facilitate decoding, the transforming elements interact with the interrogation signal at different respective time delays, which are ensured by the acoustic propagation delay on the substrate. These time delays therefore dictate the minimum path length, and therefore size of the substrate. As in many microphotolithographic systems, the substrate size is related to system cost, and smaller substrates imply lower costs. Therefore, a tradeoff exists between substrate size and available encoding complexity.

The aforementioned transponder devices include a surface acoustic wave device, in which an identification code is provided as a characteristic time-domain reflection, attenuation, phase delay, and/or transducer interaction pattern in a retransmitted signal, in a system which generally requires that the signal emitted from an exciting antenna be non-stationary with respect to a signal received from the tag. This ensures that the reflected signal pattern is distinguished from the emitted signal, and can be analyzed in a plurality of states. This analysis reveals the various delay components within the device. In such a device, received RF energy, possibly with harmonic conversion, is emitted onto a piezoelectric substrate as an acoustic wave by means of an interdigital electrode system, from whence it travels through the substrate, interacting with reflecting, delay or resonant/frequency selective elements in the path of the wave. A portion of the acoustic wave is ultimately received by an interdigital electrode system, which may be the same or different than the launch transducer, and retransmitted. These devices do not require a semiconductor memory nor external electrical energy storage system, e.g., battery or capacitor, to operate. The propagation velocity of an acoustic wave in a surface acoustic wave device is slow as compared to the free space propagation velocity of a radio wave. Thus, the time for transmission between the radio frequency interrogation system and the transponder is typically short as compared to the acoustic delay of the substrate. This allows the rate of the interrogation frequency change to be based primarily on the delay characteristics within the transponder, without requiring measurements of the distance between the transponder and the interrogation system antenna.

The interrogation frequency is controlled to change sufficiently from the return or "backscatter" signal from the transponder, so that a return signal having a minimum delay may be distinguished from the interrogation frequency, and so that all of the relevant delays are unambiguously received for analysis. The interrogation frequency thus should not return to the same frequency within a minimum time-period. Generally, such systems are interrogated with a pulse transmitter or chirp frequency system.

Systems for interrogating a passive transponder employing acoustic wave devices, carrying amplitude and/or phase-encoded information are disclosed in, for example, U.S. Pat. Nos. 4,059,831; 4,484,160; 4,604,623; 4,605,929; 4,620,191; 4,623,890; 4,625,207; 4,625,208; 4,703,327; 4,724,443; 4,725,841; 4,734,698; 4,737,789; 4,737,790; 4,951,057; 5,095,240; and 5,182,570, expressly incorporated herein by reference. Other passive interrogator label systems are disclosed in the U.S. Pat. Nos. 3,273,146; 3,706,094; 3,755,803; and 4,058,217, expressly incorporated herein by reference.

Passive transponder tag interrogation systems are also known with separate receiving and transmitting antennas, which may be at the same frequency or harmonically related, and having the same or different polarization. Thus, in these systems, the transmitted and received signals may be distinguished other than by frequency. The acoustic wave is often a surface acoustic wave, although acoustic wave devices operating with various other wave types, such as bulk waves, are known.

The information code associated with and which identifies the passive transponder is built into the transponder at the time that a layer of metallization is finally defined on the substrate of piezoelectric material. This metallization also defines the antenna coupling, launch transducers, acoustic pathways and information code elements, e.g., reflectors and delay elements. Thus, the information code in this case is non-volatile and permanent. The information representing these elements is present in the return signal as a set of characteristic perturbations of the interrogation signal, such as a specific complex delay pattern and attenuation characteristics. In the case of a transponder tag having launch transducers and a variable pattern of reflective elements, the number of possible codes is $N \times 2^M$ where N is the number of acoustic waves launched by the transducers and M is the number of reflective element positions for each transducer. Thus, with four launch transducers each emitting two acoustic waves, and a potential set of eight variable reflective elements in each acoustic path, the number of differently coded transducers is 2048. Therefore, for a large number of potential codes, it is necessary to provide a large number of launch transducers and/or a large number of reflective elements. However, efficiency is lost with increasing acoustic path complexity (i.e., power splitting), and a large number of distinct acoustic waves reduces the signal strength of the signal encoding the information in each. Therefore, the transponder design is a tradeoff between device codespace complexity and efficiency.

The known passive acoustic transponder tag thus typically includes a multiplicity of "signal conditioning elements", i.e., delay elements, reflectors, and/or amplitude modulators, which are coupled to receive the first signal from a transponder antenna. Each signal conditioning element provides an intermediate signal having a known delay and a known amplitude modification to the acoustic wave interacting with it. Even where the signal is split into multiple portions, it is advantageous to reradiate the signal through a single antenna. Therefore, a "signal combining element" coupled to the all of the acoustic waves, which have interacted with the signal conditioning elements, is provided for combining the intermediate signals to produce the radiated transponder signal. The radiated signal is thus a complex composite of all of the signal modifications, which may occur within the transponder, modulated on the interrogation wave.

In known passive acoustic transponder systems, the transponder remains static over time, so that the encoded information is retrieved by a single interrogation cycle, representing the state of the tag, or more typically, obtained as an inherent signature of an emitted signal due to internal time delays. In order to determine a transfer function of a passive transponder device, the interrogation cycle may include measurements of excitation of the transponder at a number of different frequencies. This technique allows a frequency domain analysis, rather than a time domain analysis of an impulse response of the transponder. This is particularly important since time domain analysis requires very high time domain resolution, e.g., <100 nS, to accurately capture the characteristics of the encoding, while frequency domain analysis does not impose such stringent requirements on the analysis system.

Passive transponder encoding schemes include selective modification of interrogation signal transfer function H(s) and delay functions f(z). These functions therefore typically generate a return signal in the same band as the interrogation signal. Since the return signal is mixed with the interrogation signal, the difference between the two will generally define the information signal, along with possible interference and noise. By controlling the rate of change of the interrogation signal frequency with respect to a maximum round trip propagation delay, including internal delay, as well as possible Doppler shift, the maximum bandwidth of the demodulated signal may be controlled. Thus, the known systems seek to employ a chirp interrogation waveform which allows a relatively simple processing of limited bandwidth signals.

Typically, the interrogator transmits a first signal having a first frequency that successively assumes a plurality of incremental frequency values within a prescribed frequency range. This first frequency may, for example, be in the range of 905–925 MHz, referred to herein as the nominal 915 MHz band, a frequency band that is commonly available for unlicensed use. Of course, other bands may be used, and preferably these are bands which do not require a license, and are available worldwide for use. These bands extend, for example, from 100 MHz to 25 GHz. Of course, licensed bands and locally available bands may be used. The response of the tag to excitation at any given frequency is distinguishable from the response at other frequencies, due to the relationship of the particular frequency and fixed time delays.

Preferably, the passive acoustic wave transponder tag includes at least one element having predetermined characteristics, which assists in synchronizing the receiver and allowing for temperature compensation of the system. As the temperature changes, the piezoelectric substrate may expand and contract, altering the characteristic delays and other parameters of the tag. Variations in the transponder response due to changes in temperature thus result, in part, from the thermal expansion of the substrate material. Although propagation distances are small, an increase in temperature of only 20° C. can produce an increase in propagation time by the period of one entire cycle at a transponder frequency of about 915 MHz; correspondingly, a change of about 1° C. results in a relative phase change of about 18°.

A known transponder is constructed such that $i^{th}$ delay time $t_i = T_0 + K\Delta T + \Delta V_i$, where K is a proportionality constant, $\Delta T$ is the nominal, known difference in delay time between the intermediate signals of two particular successive ones of the signal delay elements in the group, and $\Delta V_i$ is a modification factor due to inter-transponder variations, such as manufacturing variations. By measuring the quantities $\Delta T$ and $\Delta V_i$, it is possible, according to known techniques, to determine the expected delay time $t_i - T_0$ for each and every signal delay element from the known quantities K, $\Delta T$ and $\Delta V_i$. The manufacturing variations $n\Delta V_i$ comprise a "mask" variation $\Delta M_i$ due to imperfections in the photolithographic mask; an "offset" variation $\Delta O_i$ which arises from the manufacturing process used to deposit the metal layer on the piezoelectric substrate; and a random variation $\Delta R_i$ which is completely unpredictable but usually neglectably small. Specific techniques are available for determining and compensating both the mask variations $\Delta M_i$ and the offset variations $\Delta O_i$.

The known chirp interrogation system for interrogating surface acoustic wave transponder system provides a number of advantages, including high signal-to-noise performance. Further, the output of the signal mixer—namely, the signal which contains the instantaneous difference frequencies of the interrogating chirp signal and the transponder reply signal, typically fall in (or may be made to fall in) the range below 3000 Hz, and thus may be transmitted over inexpensive, shielded, audio-grade twisted-pair wires, and indeed may possibly be transmitted over the telephony infrastructure. Furthermore, since signals of this type are not greatly attenuated or dispersed when transmitted over long distances, the signal processor may be located at a position quite remote from the signal mixer, or provided as a central processing site for multiple interrogator antennae.

Another known type of interrogation system employs impulse excitation. These systems require broadband transponder signal analysis, and thus cannot typically employ audio frequency (low frequency) analysis systems. This impulse excitation interrogation system does not seek to analyze the response of fixed elements within the passive transponder to a plurality of different excitation challenges.

A known surface acoustic wave passive interrogator label system, as described, for example, in U.S. Pat. Nos. 4,734,698; 4,737,790; 4,703,327; and 4,951,057, expressly incorporated herein by reference, includes an interrogator having a voltage controlled oscillator which produces a first radio frequency signal determined by a control voltage. This first signal is amplified by a power amplifier and applied to an antenna for transmission to a remote transponder as an interrogation signal. As is known, the voltage controlled oscillator may be replaced with other oscillator (or signal generator) types.

The first signal is received by an antenna of the remote transponder and passed to a signal transforming element, which converts the first (interrogation) signal into a second (reply) signal, encoded with a characterizing information pattern. The information pattern is encoded by a series of elements having characteristic delay periods $T_0$ and $\Delta T_1$, $\Delta T_2$, ... $\Delta T_N$.

Two common types of systems exist. In a first, the delay periods correspond to physical delays in the propagation of the acoustic signal. After passing each successive delay, a portion of the signal $I_0, I_1, I_2 \ldots I_N$ is tapped off and supplied to a summing element. The resulting signal, which is the sum of the intermediate signals $I_0 \ldots I_N$, is fed back to a transponder tag antenna, which may be the same or different than the antenna which received the interrogation signal, for transmission to the interrogator/receiver antenna. In a second system, the return signal is composed of sets of reflected signals, resulting from reflectors in the path of the signal which reflect portions of the acoustic wave back to the launch transducer, where they are converted back to an electrical signal and emitted by the transponder tag antenna. The second signal is passed either to the same or different antenna of the remote transponder for transmission back to the interrogator/receiver apparatus. In both cases, between the taps or reflectors, signal modification elements, such as delay pads, selectively modify the signal. This second signal carries encoded information which, at a minimum, identifies the particular transponder.

The transponder serves as a signal transforming element, which comprises N+1 signal conditioning elements and a signal combining element, where necessary. The signal conditioning elements are selectively provided to impart a different response code for different transponders, and which may involve separate intermediate signals $I_0, I_1 \ldots I_N$ within the transponder. Each signal conditioning element comprises a known delay $T_i$ and a known amplitude modification $A_i$ (either attenuation or amplification). The respective delay $T_i$ and amplitude modification $A_i$ may be functions of the frequency of the received first signal, may provide a constant delay and constant amplitude modification, respectively, independent of frequency or may have differing dependency on frequency. The order of the delay and amplitude modification elements may be reversed; that is, the amplitude modification elements $A_i$ may precede the delay elements $T_i$. Amplitude modification $A_i$ can also occur within the path $T_i$. The signals are combined, where necessary, in a combining element which combines these intermediate signals (e.g., by addition, multiplication or the like) to form the second (reply) signal S2 and the combined signal is emitted by the transponder antenna.

The second signal is picked up by a receiving antenna of the interrogation apparatus. Both this second signal and the first signal (or respective signals derived from these two signals) are applied to a mixer (four quadrant multiplier) to produce a third signal containing frequencies which include both the sums and the differences of the frequencies contained in the first and second signals. The third signal is then low-pass filtered (to pass the difference frequency and block the input signals and sum frequency), digitized and passed to a digital signal processor which determines the amplitude $a_i$ and the respective phase $\phi_i$ of each frequency component $f_i$ among a set of frequency components $(f_0, f_1, f_2 \ldots )$ in the filtered third signal. The filter thus distinguishes the sum and difference components, and prevents aliasing in the analog-to-digital converter. Typically, the low pass filter is set to have a narrow passband, to filter transients and reduce Gaussian noise. For example, in a known system with a frequency hopping rate of 8,000 per second, the filter has a cutoff of about 3,000 Hz. This narrow bandwidth allows a relatively slow analog to digital converter, e.g., about 10 ksps, to be employed to digitize the signal.

Each phase $\phi_i$ is determined with respect to the phase $\phi_0 = 0$ of the lowest frequency component $f_0$. The third signal may be intermittently supplied to the mixer by means of a switch, and indeed the signal processor may be time-division multiplexed to handle a plurality of mixed (demodulated) signals from different antennas.

The information determined by the digital signal processor is passed to a microprocessor computer system. This computer system analyzes the frequency, amplitude and phase information and makes decisions based upon this information. For example, the computer system may determine the identification number of the interrogated transponder. This identification number and/or other decoded information is made available at an output.

In one known interrogation system embodiment, the voltage controlled oscillator is controlled to produce a sinusoidal RF signal with a frequency that is incrementally swept in 128 equal discrete steps from 905 MHz to 925 MHz. Each frequency step is maintained for a period of 125 microseconds so that the entire frequency sweep is carried out in 16 milliseconds, with a step rate of 8 kHz. Thereafter, the frequency is dropped back to 905 MHz in a relaxation period of 0.67 milliseconds. This stepwise frequency sweep approximates a linear frequency sweep. In this embodiment, each delayed component within the reply (second) signal has a different frequency with respect to the instantaneous interrogation (first) signal.

Assuming a round-trip, radiation transmission time of $t_0$, the total round-trip times between the moment of transmission of the first signal and the moments of reply of the second signal will be $t_0+T_0, t_0+T_1, \ldots t_0+T_N$, for the delays $T_{0N}, T \ldots, T_1$ respectively. Considering only the transponder delay $T_N$, at the time $t_R$ when the second (reply) signal is received at the antenna, the frequency of this second signal will be $\Delta f_N$ less than the instantaneous frequency of the first signal transmitted by the interrogator system antenna. Thus, if the first and second signals are mixed or "homodyned", this frequency difference $\Delta f_N$ will appear in the third signal as a beat frequency. Understandably, other beat frequencies will also result from the other delayed frequency spectra resulting from the time delays $T_0, T_1 \ldots T_{N-1}$. In the case of a "chirp" waveform, the difference between the emitted and received waveform will generally be constant, and therefore the relationship of each delayed component can be determined.

As can be seen, in this embodiment, all significant components of the third (mixed) signal will be within a limited range defined by the maximum delay within the transponder signal transformer and the chirp rate. Thus, this signal may be band limited within this range without loss of significant information. In a known system with a chirp range of 20 MHz, over a cycle period of 16 mS, with 128 transitions, the frequency difference per transition is 156,250 Hz.

In one embodiment of a passive transponder, the internal circuit is a surface acoustic wave device which operates to convert the received first signal into an acoustic wave, and then to reconvert the acoustic energy back into the second signal for transmission via a dipole antenna. The signal transforming element of the transponder includes a piezoelectric substrate material such as a lithium niobate (LiNbO$_3$) crystal, which has a free surface acoustic wave propagation velocity of about 3488 meters/second. The substrate is, for example, a 3 mm by 5 mm rectangular slab having a thickness of 0.5 mm. On the surface of this substrate is deposited a layer of metal, such as aluminum, forming a pattern which includes transducers and delay/reflective elements. Each delay element has a width sufficient to delay the propagation of the surface acoustic wave from one tap transducer to the next by one quarter cycle or 90° with respect to an undelayed wave at the frequency of operation (in the 915 MHz band). By providing locations for three delay pads between successive tap transducers, the phase $\phi$ of the surface acoustic wave received by a tap transducer may be controlled to provide four phase possibilities, zero pads=0°; one pad=90°; two pads=180°; and three pads=270°. These pads may be selectively deposited as a metallization layer during manufacture, or formed in a complete complement and selectively removed during a secondary process to encode the transponder. Where a reflective element returns the signal to the launch transducer, the delays are calculated based on two passes over the pad. Typically, a reflective or semireflective element is provided between each set of delay pads to allow them to be distinguished, and allowing, in the case of semireflective elements, for a series of sets of delay pads to be disposed along the path of an acoustic wave. As the number of sets of delay pads increases, the signal to noise ratio in the transponder reply signal is severely degraded. This limitation on the number of tap transducers places a limitation on the length of the informational code imparted in the transponder replies.

A plurality of launch transducers may be connected to common bus bars which, in turn, are connected to the dipole antenna of the transponder. Each launch transducer may have a forward and backward wave, and, indeed, care must be taken to damp a reverse wave where this emission is undesired in order to reduce interference. Thus, the codespace of the transponder may include a plurality of sets of encoding elements, each associated with a particular wavepath. Opposite each launch transducer is one or more reflectors, which reflect surface acoustic waves back toward the transducers which launched them. Since the transducers are connected in parallel, a radio frequency interrogation pulse is received by all the transducers essentially simultaneously. Consequently, these transducers simultaneously generate surface acoustic waves which are transmitted outward in both directions. The system is configured so that the reflected surface acoustic waves are received by their respective transducers at staggered intervals, so that a single interrogation pulse produces a series of reply pulses after respective periods of delay.

FIG. 1 shows a known an interrogator system comprising a voltage controlled oscillator 10 which produces a first signal S1 at a radio frequency determined by a control voltage V supplied by a control unit 12. This signal S1 is amplified by a power amplifier 14 and applied to an antenna 16 for transmission to a transponder 20.

The signal S1 is received at the antenna 18 of the transponder 20 and passed to a signal transforming element 22. This signal transformer converts the first (interrogation) signal S1 into a second (reply) signal S2, encoded with an information pattern. The information pattern is encoded as a series of elements having characteristic delay periods $T_0$ and $\Delta T_1$, $\Delta T_2$, ... $\Delta T_N$. Two common types of transducer devices exist. In a first, shown schematically in FIG. 5, the delay periods correspond to physical delays in the propagation of the acoustic signal. After passing each successive delay, a portion of the signal $I_0, I_1, I_2 \ldots I_N$ is tapped off and supplied to a summing element. The resulting signal S2, which is the sum of the intermediate signals $I_0 \ldots I_N$, is fed back to a transponder tag antenna, which may be the same or different than the antenna which received the interrogation signal, for transmission to the interrogator/receiver antenna. In a second system, shown schematically in FIG. 4, the delay periods correspond to the positions of reflective elements, which reflect portions of the acoustic wave back to the launch transducer, where they are converted back to an electrical signal and emitted by the transponder tag antenna.

The signal S2 is passed either to the same antenna 18 or to a different antenna 24 for transmission back to the interrogator/receiver apparatus. This second signal S2 carries encoded information which, at a minimum, identifies the particular transponder 20.

The signal S2 is picked up by a receiving antenna 26. Both this second signal S2 and the first signal S1 (or respective signals derived from these two signals) are applied to a mixer (four quadrant multiplier) 30 to produce a third signal S3 containing frequencies which include both the sums and the differences of the frequencies contained in the signals S1 and S2. The signal S3 is passed to a signal processor 32 which determines the amplitude $a_i$ and the respective phase $\phi_i$ of each frequency component $f_i$ among a set of frequency components ($f_0, f_1, f_2 \ldots$) in the signal S3. Each phase $\phi_i$ is determined with respect to the phase $\phi_0=0$ of the lowest frequency component $f_0$. The signal S3 may be intermittently supplied to the mixer by means of a switch.

The information determined by the signal processor 32 is passed to a computer system comprising, among other elements, a random access memory (RAM) 34 and a microprocessor 36. This computer system analyzes the frequency, amplitude and phase information and makes decisions based upon this information. For example, the computer system may determine the identification number of the interrogated transponder 20. This I.D number and/or other decoded information is made available at an output 38.

The transponder, as shown in FIG. 2, serves as a signal transforming element 22, which comprises N+1 signal conditioning elements 40 and a signal combining element 42. The signal conditioning elements 40 are selectively provided to impart a different response code for different transponders, and which may involve separate intermediate signals $I_0, I_1, \ldots I_N$ within the transponder. Each signal conditioning element 40 comprises a known delay $T_i$ and a known amplitude modification $A_i$ (either attenuation or amplification). The respective delay $T_i$ and amplitude modification $A_i$ may be functions of the frequency of the received signal S1, or they may provide a constant delay and constant amplitude modification, respectively, independent of frequency. The time delay and amplitude modification may also have differing dependency on frequency. The order of the delay and amplitude modification elements may be reversed; that is, the amplitude modification elements $A_i$ may precede the delay elements $T_i$. Amplitude modification $A_i$ can also occur within the path $T_i$.

The signals are combined in combining element 42 which combines these intermediate signals (e.g., by addition, multiplication or the like) to form the reply signal S2 and the combined signal emitted by the antenna 18.

In one embodiment, as shown in FIG. 3A and 3B, the voltage controlled oscillator 10 is controlled to produce a sinusoidal RF signal with a frequency that is swept in 128 equal discrete steps from 905 MHz to 925 MHz. Each frequency step is maintained for a period of 125 microseconds so that the entire frequency sweep is carried out in 16 milliseconds. Thereafter, the frequency is dropped back to 905 MHz in a relaxation period of 0.67 milliseconds. The stepwise frequency sweep 46 shown in FIG. 3B thus approximates the linear sweep 44 shown in FIG. 3A.

Assuming that the stepwise frequency sweep 44 approximates an average, linear frequency sweep or "chirp" 47, FIG. 3B illustrates how the transponder 20, with its known, discrete time delays $T_0, T_1 \ldots T_N$ produces the second (reply) signal 52 with distinct differences in frequency from the first (interrogation) signal 51. Assuming a round-trip, radiation transmission time of $t_0$, the total round-trip times between the moment of transmission of the first signal and the moments of reply of the second signal will be $t_0+T_0$, $t_0+T_1$, ... $t_0+T_N$, for the delays $T_{0N}$, T ..., $T_1$ respectively. Considering only the transponder delay $T_N$, at the time $t_R$ when the second (reply) signal is received at the antenna 26, the frequency 48 of this second signal will be $\Delta f_N$ less than the instantaneous frequency 47 of the first signal S1 transmitted by the antenna 16. Thus, if the first and second signals are mixed or "homodyned", this frequency difference $\Delta f_N$ will appear in the third signal as a beat frequency. Understandably, other beat frequencies will also result from the other delayed frequency spectra 49 resulting from the time delays $T_0$, $T_1$ ... $T_{N-1}$. Thus, in the case of a "chirp" waveform, the difference between the emitted and received waveform will generally be constant.

In mathematical terms, we assume that the phase of a transmitted interrogation signal is $\phi=2\pi f \tau$, where $\tau$ is the round-trip transmission time delay. For a ramped frequency df/dt or f, we have: $2\pi f \tau = d\phi/dt = \omega$. $\omega$, the beat frequency, is thus determined by T for a given ramped frequency or chirp f. In this case, the (mixed) signal S3 may be analyzed by determining a frequency content of the S3 signal, for example by applying it to sixteen bandpass filters, each tuned to a different frequency, $f_0$, $f_1$, ... $f_E$, $f_F$. The signal processor determines the amplitude and phase of the signals that pass through these respective filters. These amplitudes and phases contain the code or "signature" of the particular signal transformer 22 of the interrogated transponder 20. This signature may be analyzed and decoded in known manner.

In one embodiment of a passive transponder, shown in FIGS. 6 and 7, the internal circuit operates to convert the received signal S1 into an acoustic wave and then to reconvert the acoustic energy back into an electrical signal S2 for transmission via a dipole antenna 70, connected to, and arranged adjacent a SAW device made of a substrate 72. More particularly, the signal transforming element of the transponder includes a substrate 72 of piezoelectric material such as a lithium niobate ($LiNbO_3$) crystal, which has a free surface acoustic wave propagation velocity of about 3488 meters/second. On the surface of this substrate is deposited a layer of metal, such as aluminum, forming a pattern which includes transducers and delay/reflective elements.

One transducer embodiment includes a pattern consisting of two bus bars 74 and 76 connected to the dipole antenna 70, a "launch" transducer 78 and a plurality of "tap" transducers 80. The bars 74 and 76 thus define a path of travel 82 for a surface acoustic wave which is generated by the launch transducer and propagates substantially linearly, reaching the tap transducers each in turn. The tap transducers convert the surface acoustic wave back into electrical energy which is collected and therefore summed by the bus bars 74 and 76. This electrical energy then activates the dipole antenna 70 and is converted into electromagnetic radiation for transmission as the signal S2.

The tap transducers 80 are provided at equally spaced intervals along the surface acoustic wave path 82, as shown in FIG. 6, and an informational code associated with the transponder is imparted by providing a selected number of "delay pads" 84 between the tap transducers. These delay pads, which are shown in detail in FIG. 7, are preferably made of the same material as, and deposited with, the bus bars 74, 76 and the transducers 78, 80. Each delay pad has a width sufficient to delay the propagation of the surface acoustic wave from one tap transducer 80 to the next by one quarter cycle or 90° with respect to an undelayed wave at the frequency of operation (in the 915 MHz band). By providing locations for three delay pads between successive tap transducers, the phase f of the surface acoustic wave received by a tap transducer may be controlled to provide four phase possibilities, zero pads=0°; one pad=90°; two pads=180°; and three pads=270°.

The phase information $\phi_0$ (the phase of the signal picked up by the first tap transducer in line), and $\phi_1$, $\phi_2$, $\phi_N$ (the phases of the signals picked up by the successive tap transducers) is supplied to the combiner (summer) which, for example, comprises the bus bars 74 and 76. This phase information, which is transmitted as the signal S2 by the antenna 70, contains the informational code of the transponder. The Signal S2 also includes interrogation frequency-dependent amplitude variations as a result of the encoding elements, which typically also provide information for decoding the transponder identity.

As shown in FIG. 7, the three delay pads 84 between two tap transducers 80 are each of such a width L as to each provide a phase delay of 90° in the propagation of an acoustic wave from one tap transducer to the next as compared to the phase in the absence of such a delay pad. This width L is dependent upon the material of both the substrate and the delay pad itself as well as upon the thickness of the delay pad and the wavelength of the surface acoustic wave.

The transducers are typically fabricated by an initial metallization of the substrate with a generic encoding, i.e., a set of reflectors or delay elements which may be further modified by removal of metal to yield the customized transponders. Thus, in the case of delay pads, three pads are provided between each set of transducers or taps, some of which may be later removed. Where the code space is large, the substrates may be partially encoded, for example with higher order code elements, so that only the lower order code elements need by modified in a second operation.

While a system of the type described above operates satisfactorily when the number of tap transducers does not exceed eight, the signal to noise ratio in the transponder reply signal is reduced as the number of tap transducers increases. This is because the tap transducers additionally act as launch transducers as well as partial reflectors of the surface acoustic wave so that an increase in the number of tap transducers results in a corresponding increase in spurious signals in the transponder replies. This limitation on the number of tap transducers places a limitation on the length of the informational code imparted in the transponder replies.

Spurious signals as well as insertion losses may be reduced in a passive transponder so that the informational code may be increased in size to any desired length, by providing one or more surface acoustic wave reflectors on the piezoelectric substrate in the path of travel of the surface acoustic wave, to reflect the acoustic waves back toward a transducer for reconversion into an electric signal.

Surface acoustic waves may encounter frequency selective filtering structures, partial reflectors, full reflectors, phase delay pads or electroacoustic transducing elements as they travel across the substrate, which is typically lithium niobate ($LiNbO_3$) which has a surface acoustic wave propagation velocity of 3488 m/sec and is piezoelectric. The system may have a single acoustic path or sets of acoustic paths which are, for example, parallel, as shown in FIG. 8A.

A wavefront produced by reflections from the leading and trailing edges of transducer fingers will be formed by the superposition of a first wave reflected from the first leading edge and successive waves reflected from successive edges and having differences in phase, with respect to the first wave, of $-\lambda/4$, $\lambda/2$, $-3\lambda/4$, $\lambda$, etc. As may be seen, the wave components having a phase $-\lambda/4$, $\lambda/2$ and $-3\lambda/4$ effect a cancellation, or at least an attenuation of the wave component reflected from the leading edge.

The interdigital fingers of the transducers may therefore be advantageously split to reduce reflections. Conventional interdigital finger transducers which are constructed to operate at a fundamental, resonant frequency of 915 MHz, have a finger width ($\lambda/4$) of approximately 1 micron; a size which approaches the resolution limit of certain photolithographic fabrication techniques (the selective removal of metallization by (1) exposure of photoresist through a mask and (2) subsequent etching of the metallized surface to selectively remove the metal between and outside the transducer fingers). If the fingers are split, the width of each finger ($\lambda/8$) for a fundamental frequency of 915 MHz would be approximately 0.5 micron. The size would require sophisticated photolithographic fabrication techniques. In order to increase the feature sizes, the transducers in the transponder are constructed with a resonant frequency $f_0$ of 305 MHz. In this case, the width of each finger is three times larger than transducer fingers designed to operate at 915 MHz, so that the width ($\lambda/8$) of the split fingers is approximately 1.5 microns. This is well within the capability of typical photolithographic fabrication techniques. Although such transducers are constructed with a resonant frequency of 305 MHz, they are nevertheless driven at the interrogation frequency of approximately 915 MHz; i.e., a frequency $3f_0$ which is the third harmonic of 305 MHz. The energy converted by a transducer, when driven in its third harmonic $3f_0$ (915 MHz), is about ⅓ of the energy that would be converted if the transducer were driven at its fundamental frequency $f_0$ (305 MHz). Accordingly, it is necessary to construct the transducers to be as efficient as possible within the constraints imposed by the system. As is well known, it is possible to increase the percentage of energy converted, from electrical energy to SAW energy and vice versa, by increasing the number of fingers in a transducer. In particular, the converted signal amplitude is increased by about 2% for each pair of transducer fingers (either conventional fingers or split fingers) so that, for 20 finger pairs for example, the amplitude of the converted signal will be about 40% of the original signal amplitude. Such an amplitude percentage would be equivalent to an energy conversion of about 16%. In other words, the energy converted will be about 8 dB down from the supplied energy.

The edge portions of the delay pads, as well as the lateral edges of the bus bars and (i.e., the edges transverse to the SAW paths of travel) are advantageously provided with two levels of serrations, which substantially reduce SAW reflections from these edges. The serrations include, for example, two superimposed "square waves" having the same pulse height but different pulse periods. For example, the pulse height for both square waves is $\lambda/4$, and the pulse period is $\lambda/3$ for one square wave and $6\lambda$ for the other, where $\lambda$ is the SAW wavelength at 915 MHz. The first level of serrations serves to reduce reflections, while the second level serves to break up the average reflection plane.

The addition of finger pairs to the transducers therefore advantageously increases the energy coupling between electrical energy and SAW energy. However, as explained above in connection with FIGS. 1, 3A and 3B, the system according to the invention operates to excite the transducers over a range of frequencies between 905 MHz and 925 MHz. This requires the transducers to operate over a 20–25 MHz bandwidth: a requirement which imposes a constraint upon the number of transducer finger pairs because the bandwidth of a transducer is inversely proportional to its physical width. This relationship arises from the fact that the bandwidth is proportional to $1/\tau$, where $\tau$ is the SAW propagation time from one side of the transducer to the other (the delay time across the transducer).

The transducer may be divided into several separate sections: a central section, two flanking sections and two outer sections. The central section includes interdigital transducer fingers which are alternately connected to two outer bus bars and to a central electrical conductor. This central section comprises a sufficient number of finger pairs to convert a substantial percentage of electrical energy into SAW energy and vice versa. By way of example and not limitation, there may be 12 finger pairs so that the converted amplitude is approximately 24% of the incoming signal amplitude. Flanking the central section, on both sides, are sections containing "dummy" fingers; that is, fingers which are connected to one electrode only and therefore serve neither as transducers nor reflectors. The purpose of these fingers is to increase the width of the transducer so that the outer sections will be spaced a prescribed distance, or SAW delay time, from the central section. For example, there may be 7 dummy fingers (or, more particularly, split fingers) in each of the sections. Finally, each of the outer sections of the transducer contains a single transducer finger pair which is used to shape the bandwidth of the transducer, e.g., maintain an effective bandwidth of about 25 MHz.

The transducer system preferably has an electrical impedance at the design frequency which matches the impedance of the antenna coupling, to maximize the power transfer between the antenna system and transducer. This matching is accomplished by forming series connections of transducer structures, which present as capacitive loads, to reduce impedance, as necessary, and providing heavy metal traces for the bus bars to reduce Ohmic losses. The bus bars are, for example, made approximately twice as thick as the other metallized elements on the substrate.

In practice, the metallization is deposited on the substrate surface using a two-layer photolithographic process. Two separate reticles are used in forming the photolithographic image: one reticle for the transducers, reflectors and phase pads as well as the alignment marks on the substrate, and a separate reticle for the bus bars. The process thus comprises the steps of depositing a 300 Angstrom layer of chromium and then 1000 Angstrom layer of aluminum on the substrate, followed by UV-exposure solubleizing resin spin coating, masking and etching of the bus bars, followed by deposition of 1000 Angstroms of aluminum and another UV activated resin spin coating, masking and etching to form the transducers, reflectors and phase pads as well as the alignment marks on the substrate, doubling the thickness of the bus bar structures.

Each two successive fingers of a transducer may be shorted at one or more locations between the bus bars. The shorts between successive fingers reduce energy loss due to Ohmic resistance of the fingers and render the reflector less susceptible to fabrication errors.

These various techniques and systems, described above, may advantageously be employed or combined with aspects of the present invention in known manner to achieve desired results.

The embodiment of FIG. 8A comprises a substrate 120 of piezoelectric material, such as lithium niobate, on which is deposited a pattern of metallization essentially as shown. The metallization includes two bus bars 122 and 124 for the transmission of electrical energy to four launch transducers 126, 128, 130 and 132. These launch transducers are staggered, with respect to each other, with their leading edges separated by distances X, Y and Z, respectively, as shown. The distances X and Z are identical; however, the distance Y is larger than X and Z in order to provide temporal separation of the received signals corresponding to the respective signal paths. Further metallization includes four parallel rows of delay pads 134, 136, 138 and 140 and four parallel rows of reflectors 142, 144, 146, and 148. The two rows of reflectors 144 and 146 which are closest to the transducers are called the "front rows" whereas the more distant rows 142 and 148 are called the "back rows" of the transponder. The bus bars 122 and 124 include contact pads 150 and 152, respectively, to which are connected the associated poles 154 and 156 of a dipole antenna. These two poles are connected to the contact pads by contact elements or wires 158 and 160, represented in dashed lines.

The provision of four transducers 126, 128, 130 and 132 and two rows of reflectors 142, 144, 146, and 148 on each side of the transducers results in a total of sixteen SAW pathways of different lengths and, therefore, sixteen "taps". These sixteen pathways (taps) are numbered 0, 1, 2 . . . D, E, F, as indicated by the reference number (letter) associated with the individual reflectors. Thus, pathway 0 extends from transducer 126 to reflector 0 and back again to transducer 126. Pathway 1 extends from transducer 128 to reflector 1 and back again to transducer 128. The spatial difference in length between pathway 0 and pathway 1 is twice the distance X (the offset distance between transducers 126 and 128). This results in a temporal difference of $\Delta T$ in the propagation time of surface acoustic waves. Similarly, pathway 2 extends from transducer 126 to reflector 2 and back again to transducer 126. Pathway 3 extends from transducer 128 to reflector 3 and back to transducer 128. The distance X is chosen such that the temporal differences in the length of the pathway 2 with respect to that of pathway 1, and the length of the pathway 3 with respect to that of pathway 2 are also both equal to $\Delta T$. The remaining pathways 4, 5, 6, 7 . . . E, D, F are defined by the distances from the respective transducers launching the surface acoustic waves to the associated reflectors and back again. The distance Y is equal to substantially three times the distance X so that the differences in propagation times between pathway 3 and pathway 4 on one side of the device, and pathway B and pathway C on the opposite side are both equal to $\Delta T$. With one exception, all of the temporal differences, from one pathway to the next successive pathway are equal to the same $\Delta T$. The SAW device is dimensioned so that $\Delta T$ nominally equals 100 nanoseconds. In order to avoid the possibility that multiple back and forth propagations along a shorter pathway (one of the pathways on the left side of the SAW device as seen in FIG. 1) appear as a single back and forth propagation along a longer pathway (on the right side of the device), the difference in propagation times along pathways 7 and 8 is made nominally equal to 150 nanoseconds.

FIG. 8B shows, for a single transducer 125, connected between bus bars 122 and 124, a set o acoustic wave paths reflecting off encoding elements and returning to the transducer 125.

SUMMARY AND OBJECTS OF THE INVENTION

One aspect of the present invention provides an acoustic beam path on the substrate having at least one reflection or acoustic beam redirection at an angle differing from $\pi/2$ radians. This redirection may be by acoustic reflection, trackchangers (electroacoustic devices which efficiently receive and transmit acoustic waves having differing propagation vectors, typically inclined at $\pi/4$ radians), acoustic waveguide structures, or the like. As such, the acoustic path is bent, thereby reducing the linear dimension of the substrate required for a given maximum acoustic path length. Partially reflective elements may also be used to split acoustic beam energy, providing multiple acoustic paths.

The present invention provides a folded acoustic path which efficiently makes use of the substrate surface area while allowing a relatively large code space. The folded acoustic path is effected by the use of high efficiency reflectors, which allow acoustic path elongation without large substrate linear dimensions.

According to one embodiment of the present invention, the signal path is folded by so-called trackchangers to provide a very compact arrangement while retaining flexibility to implement complex codespaces. Advantageously, an acoustic path may zigzag over the surface of the substrate, guided by acoustically-reflective elements. Alternately, the acoustic path spirals a peripheral portion of the substrate, and interacts with acoustic structures in a central portion of the substrate to provide an individual response.

A preferred embodiment of the invention employs right angle track changers to redirect the acoustic wave on the substrate with high efficiency. This overall pattern is folded, and may take any configuration, resulting in more efficient utilization of substrate surface area. The track changers are formed using the normal metallization process during manufacture, and therefore do not significantly increase costs or manufacturing complexity, while reducing die size. Advantageously, the right angle track changers may be semireflective, at least along one axis, resulting in an acoustic energy splitter/recombiner. Therefore, portions of the acoustic wave energy intersecting the location of a track changer are redirected at right angles, while another portion passes along its incident vector. When a series of such structures are placed in series, the reflectivities may be adjusted to equalize the acoustic power through each redirected path, or the energy attributable to each path in a return signal.

The main object of using 90 degree trackchangers is thus to be able to fold the delay line paths to minimize the die size for delay lengths that are significantly increased compared to unfolded acoustic path designs. An ideal trackchanger has very low insertion loss and is compact, so as to minimize the required width of a net 180 degree turn, i.e., two 90 degree trackchangers in sequence. Practical trackchangers are not quite ideal; with an estimate of approx. 1.5 dB per 90 degree turn insertion loss in a typical 900 MHz design employing aluminum metallization on a lithium niobate substrate. This loss, while not insignificant, does allow useful designs to be implemented with a number of such track changers in the acoustic path. A multistrip coupler type, i.e., an acoustic device having split signal traveling over sets of parallel acoustic paths, requires some area, with a minimum of 2–2.5 times the active trackwidth of open space between reversed tracks.

In order to minimize multipath problems in a 16 tap structure, e.g., a device having 16 sets of encoding elements disposed along the acoustic path, a 2 or 4 transducer parallel path configuration is preferred. Thus, in a 2 transducer system, each transducer generating a forward and reverse signal path, 4 taps are provided in each path; in a 4 transducer system, 2 taps are provided in each path.

Ideal trackchangers generate no spurious responses. Typically, multipath spurious signals are caused by multiple reflections inside an array of reflectors or between arrays on both sides of a transducer. By increasing the first tap delay to greater than 2 microseconds, the latter can be distinguished in the received signal as an "early" response, and therefore should represent no problem. A worst case scenario is calculated from the following:

Let the tap reflection and transmission coefficients be r and t, respectively. We may approximate:

$$t=t0 \, sqrt(1-|r|^2),$$

where t0 represents the attenuation between taps

We further assume that the phase delay (worst case) is the same between all taps in a cascade. We keep track of this delay with the symbolic parameter x. The reflection r2, and transmission t2, of two taps in cascade can thus be written:

$$r2=r[1+tA2x/(1+|r|^2x)],$$

$$t2=t^2 \, x/(1+|r|^2x)$$

For 4, 8 and 16 taps in cascade we have, respectively:

$$r4=r2[1+(r2/r-1)^2/(1+r2^2)]$$

$$r8=r4[1+(r4/r2-1)^2/(1+r4^2)]$$

$$r16=r8[1+(r8/r4-1)^2/(1+r8^2)]$$

where we have assumed that r, r2 etc. are positive, real quantities.

By performing a series expansion in x, the worst case multipath spurious problem is revealed. For simplicity, we assume that each reflector has the same reflection coefficient. Table I results from calculation using Mathcad, where the worst case spurious is given relative to the "last" tap signal, assuming a tap to tap attenuation of 0.07 dB:

TABLE I

| tap refl r | 2 tap spur. dB | 4 tap spur. dB | 8 tap spur. dB | 16 tap spur. dB |
|---|---|---|---|---|
| 0.02 | −68 | −53 | −38.8 | −26.4 |
| 0.03 | −60.9 | −45.4 | −32.2 | −19.2 |
| 0.05 | −52.1 | −36.7 | −23.1 | −9.2 |
| 0.06 | −49.1 | −33.3 | −19.8 | −5.3 |
| 0.07 | −46.2 | −30.8 | −17.0 | |
| 0.12 | −36.9 | −21.2 | −6.5 | |
| 0.15 | −33.1 | −17.4 | −1.5 | |
| 0.25 | −24.0 | −7.9 | | |
| 0.3 | −20.9 | −4.2 | | |
| 0.35 | −18.2 | | | |

Let us assume that maximum allowable spurious level is −20 dB, which would also correspond to a max phase error of approximately 7 degrees. If we further assume that increasing the number of parallel paths by a factor of two increases the insertion loss by 6 dB; we arrive at the following insertion loss table:

TABLE II

| | |
|---|---|
| 1 path (16 taps cascade) | I1 (dB) insertion loss |
| 2 path (8 taps) | I1 + 6 − 6.3 = I1 − 0.3 |
| 4 path (4 taps) | I1 + 12 − 13 = I1 − 1 |
| 8 path (2 taps) | I1 + 18 − 21 = I1 − 3 |

This shows that multipath spurious interference may not be a significant problem if the reflection level is well controlled. However, there is a distinct advantage in using eight paths if the power division among the paths are well controlled.

In existing commercial systems, transponder devices are primarily encoded using a phase shift, which may also case an amplitude variation. However, it is also possible to specifically encode using amplitude and phase-amplitude modulation techniques. By employing a phase amplitude or quadrature amplitude modulation (QAM) technique, an additional degree of freedom is added to the encoding space, allowing a greater number of bits per symbol, and therefore making more efficient use of encoding space on the die. Since efficiency is lost with each set of encoding elements (e.g., a "symbol"), having greater encoding capability for a single symbol is advantageous. Of course, this requires an interrogation system adapted to detect this information. However, the encoding schemes and frequencies of operation are similar to known types of digital communication systems to allow use of similar design strategies and hardware. Essentially, in prior art designs, a net phase-amplitude response during an interrogation condition (frequency) is detected, typically by a DC voltage from a low pass filter following a homodyne detector. In contrast, a phase-amplitude modulated system requires more careful analysis of the phase-amplitude response, in order to decode more data. While separate detectors may be employed to separately detect the relative phase and relative amplitude of a response, a complex phase-amplitude detector is sufficient. As stated above, circuits and modules are available for such applications for frequencies up to 5 GHz, and beyond.

It is therefore another aspect of the present invention is to provide an efficient encoding scheme for information in backscatter signals. Active tags typically employ frequency modulation or pulse code modulation. Passive tags typically employ static sets of phase delays. However, QAM has not been implemented. This is likely because of two reasons; first, the required decoder is more complex, and second, the resulting signal has a greater dynamic range, making it potentially more subject to interference by environmental noise. However, communication systems employing QAM are well known, and highly integrated components are now available in the communication bands of interest. Further, when backscatter efficiency for phase-only encoding systems of comparable bit encoding capability are compared to QAM systems according to the present invention, the putative disadvantages of QAM are not impediments to implementation.

QAM modulation therefore provides the advantage of greater encoding efficiency of a single acoustic wavepath without requiring a signal division per encoded bit. Further, although the required receiver is more complex, the encoded signal may be more efficiently extracted from the backscatter signal, thus reducing the need for multiple interrogations; therefore, higher reliability may be obtained by statistical processing of the backscatter signal under a variety of interrogation conditions (excitation frequency). Because the acoustic signal need not be split at each set of phase pads, the signal splitting losses are minimized. Rather, the signal losses are well controlled and used to encode data.

A preferred embodiment of the QAM encoding scheme advantageously does not superpose multiple QAM signal streams simultaneously; therefore, interaction of multiple QAM encoding elements with an acoustic wave on the substrate are preferably separated, e.g., through a wave splitter or separate taps, to provide a temporal separation. This temporal separation may be achieved, for example, by folding the acoustic path. Certain techniques, however, are preferably employed to avoid loss of signal over the elongated signal path. Thus, a preferred embodiment according to the present invention employs trackchangers, which are electroacoustic devices which interact with the acoustic wave propagating on the piezoelectric substrate to efficiently absorb an incident acoustic wave propagating along axis and reemit a wave having the same frequency and relatively preserved phase characteristics along a second axis. These devices are constructed with conductors formed on the piezoelectric substrate spaced corresponding to the wavelength, e.g., odd integral multiple of half-wavelengths, each element of which being bent, such that an incident wave is transduced into an electrical signal in one portion of the conductive elements and reemitted by the other. Because the elements are spaced as approximate odd multiples of half-wavelengths, the device becomes unidirectional, with interference effects reinforcing the signal in one direction and diminishing it in the other. It is noted that the acoustic wavelength of a surface acoustic wave on a piezoelectric crystal varies according to crystal axis, and therefore, the spacing must be adjusted accordingly.

Thus, to increase coding capacity, amplitude weighting (2 levels) could be introduced in addition to quadrature phase weighting. This can also be accomplished using modified phase pads. If this is done before the signal arrives at the first tap in each path only, the implementation is simple. If the number of paths is n, the number of states is multiplied with $2^i$. For example, using 4 paths and 16 phase coded taps, we get:

Total number of states: $4^{16}\ 2^4 = 2^{36}$ or 36 binary bits.

With differential phase coding, only 14 or 15 effective taps are likely to be realizable. However, this technique is compatible with amplitude weighting, which will restore and further increase coding capacity. A preferred type of phase pad coding scheme employs partial beam width phase delay pads, which result in a net phase and amplitude change for the beam. According to one design, three types of pads are provided; a full beam width $\pi/6$ pad (60 degrees, for 6 dB reduction), a half-beam width $\pi/3$ pad (120 degrees, for 0 dB reduction), and a full beam width normal phase modulation pad. For example, the width of a non-amplitude-weighting phase pad corresponds to $\pi/4$ (90 degrees).

One or two path (unidirectional or bidirectional transducer) configurations can also be made considerably smaller by using another 180 degree trackchanger in each path; however, this incurs an additional insertion loss of approximately 6 dB.

In general, the partial beam width phase delay pads, intended to alter a phase angle of the signal, may be provided as one or more elements located at any position within the beam path. Thus, these need not be symmetric or centrally located within the acoustic beam. However, preferably, the phase-amplitude encoding technique employs symmetrically disposed, split pads, which avoid beam asymmetry effects and beam steering. Of course, such effects may also be advantageously employed to redirect the acoustic wave, however, the competing demands of low attenuation for beam direction elements, phase control, stability over temperature changes and other environmental conditions, and directional control, weigh in favor of separation of function. Therefore, according to this aspect of the present invention, a QAM modulation scheme is implemented by successive QAM modification of an acoustic wave, by stages of elements having successively more fine-grained signal modification characteristics. Therefore, a QAM-4 scheme is implemented, as known, using a pair of delay pads, having $\pi/2$ and $\pi/4$ phase shift, and essentially no attenuation (at the nominal design frequency), resulting in four relative phases, 0, $\pi/4$, $\pi/2$, and $3\pi/4$, by placing zero, a first, a second, or both first and second delay pads in the acoustic path. A QAM-16 scheme is implemented by further modulating the wave passing through the first set of elements, splitting each primary modulation state into four sub-states, resulting in 16 modulation states total. In contrast to phase-only modulation systems, no semireflective element is provided between the primary and secondary modulation elements.

In a preferred embodiment, a second set of wave modulating elements, comprising a "triplet" of phase delay elements, is provided after the first set. The triplet includes a first centered element, having a width of about one third of the beam width, and a length corresponding to a characteristic phase delay (if full beam width) of, for example, $\pi/2$ radians, resulting in a net attenuation of the signal by $\frac{1}{2}$ (50%). A pair of second elements is also provided, occupying respectively outer thirds of the beam width, and a length corresponding to a characteristic phase delay (if full beam width) of, for example, $\pi/4$ radians, resulting in a net attenuation of 2/2 and a phase shift of $\pi/8$. The first and second sets of elements of the triplet are selectively provided as no elements, the first element and/or the pair of second elements, to provide four possible arrangements, which, in combination with the first set of phase pads, result in 16 possible phase and amplitude combinations.

It is noted that, since the phase delay characteristic is subject to aliasing, the phase delays need not be limited to a $2\pi$ range. Further, the normal state may include a phase delay, allowing both positive and negative changes in relative phase delay. Therefore, in order to obtain a QAM-4 phase splitting, an element with an odd multiple of $\pi/4$ radians phase delay ($\pi/4$, $\pi/2$, $3\pi/4$, $5\pi/4$, ...) is selectively provided and/or an element with an odd multiple of $\pi/2$ radians phase delay ($\pi/2$, $\pi/2$, $3\pi/2$, $5\pi/2$, ...) is selectively provided. In a triplet, the relative phase delay between a central element may be longer or shorter than the peripheral elements. Further, a triplet structure is not necessary, as all elements may, for example, occupy the central portion of the beam. In order to obtain a symmetric phase-amplitude encoding pattern, QAM-$2^{2n}$ (e.g., QAM-4, QAM-16, QAM-64, QAM-256, ...), it is important that the beam be divided into thirds, with a modulating element occupying one or two thirds of the beam width. Since, in a preferred embodiment, the encoding elements are formed as a metallization pattern, the complexity of the pattern, once defined, does not pose a manufacturing constraint, so long as the process supports the required feature sizes and tolerances.

It is further noted that additional sets of modulation elements may be provided in like manner, for example to provide a QAM-64 signal constellation. For example, this third set of modulation elements may be an additional triplet, which occupies a third of the acoustic beam width, with each element one ninth of the beam width, and whose length corresponds to $\pi/2$ and $\pi/4$ phase characteristic phase shifts, respectively.

A QAM-256 signal constellation may be provided by providing phase-amplitude weighting elements (triplet plus 90 and 180 degree phase delay pads) occupying, respectively, one third, one ninth, and one twenty-seventh of the beam width. The ability to successively phase and amplitude modulate the signal is limited only by the manufacturing tolerances of the transponder and noise and errors in the receiver. Thus, for example, QAM-512 and higher numbers of states are possible. However, it is preferred to provide successive modulating structures with respectively larger margins than a single modulating structure which has a low margin, and thus is susceptible to errors and noise, thus making discerning modulation states accurately difficult.

In order to decode the QAM modulated signal, both phase and amplitude of a received signal must be analyzed. Therefore, the signal must not be substantially distorted in the receiver, and the complex phase-amplitude relationships preserved. It is noted that, since the encoding efficiently makes use of the phase-amplitude space, it is possible to perform a time domain analysis on well separated encoding clusters. Thus, the large number of excitation conditions which characterize the prior art systems with multiple closely-spaced phase encoded clusters may be replaced with a single, discrete impulse. However, the difficulties in employing such time domain analysis systems still remain, and therefore frequency domain interrogation systems are preferred. Thus, the QAM encoding may be employed in conjunction with prior encoding techniques, by placing QAM encoding "blocks" in series, and exciting the device at a plurality of excitation conditions (frequencies).

The receiver therefore receives the modified interrogation signal from the transponder device. This signal includes one or more reference reflections, which may be employed to determine relative changes in phase and amplitude of the modulated signal, as well as temperature and manufacturing variations. These references are provided within the transponder tag in known manner. A pulse or non-stationary interrogation signal is emitted and a backscatter signal from the transponder received. A return signal subject to QAM modulation is received separately from, typically after, a reference signal. Therefore, a local phase locked loop at the receiver may be synchronized with the reference. The received QAM response signal is then mixed with the reference, and a relative phase-amplitude response determined. This may be performed in known manner. The interrogation signal may be, for example, a frequency hopping pseudorandom sequence spread spectrum signal, with continuous or intermittent excitation with a set of frequencies spaced across the interrogation band. In a digital receiver embodiment, a direct sequence spread spectrum (DSSS) embodiment may be employed, with the receiver decoding the received backscatter signal based on its correlation with the emitted signal using digital signal processing.

In one embodiment of the present invention, a QAM-16 transponder system employs more than one set of encoding elements, and the received signal is subjected to a time domain analysis, rather than a purely frequency (and phase) domain analysis. Thus, in a prior known system, the net phase shift under a particular excitation condition, between a reference reflection and after all transients have settled, defines the response under that excitation condition. By varying excitation conditions, i.e., altering the excitation frequency, further data may be obtained, which allows both intelligent data analysis (elimination of data points which are obviously aberrant due to interference, etc.) and statistical analysis. Therefore, even assuming substantial Gaussian noise, precise QAM measurements may be obtained, given sufficient number of measurements with uncorrelated errors. Even if errors are correlated, i.e., the noise cannot be assumed to be Gaussian, precise measurements may still be obtained by characterizing and accounting for such correlated errors. Such data analysis is well known in the art, and need not be further described herein. It is noted that, where interrogation signals vary between acquired data points, a simple averaging of responses is not appropriate, and multiple responses must therefore be analyzed with this in mind.

The distance (propagation delay) between the reference and respective identification code modulators will influence the relative phase difference. This delay, however, will be affected by, e.g., temperature. As in known systems, a pair or reference reflections may be provided to allow compensation for temperature variations and manufacturing errors, the like. By exciting the transponder at a sufficient number of frequencies over a sufficient range of wavelengths, the characteristics of the modulating structures may be finely elucidated.

In addition, where the acoustic path length is folded, it becomes possible to provide a plurality of sets of sequential QAM modulating structures, each separated by a characteristic delay of sufficient duration to allow recording of the respective phase and amplitude of a preceding set of elements. In the case of multiple phase-amplitude modulating structures, these may either each modulate a portion of an unmodulated beam derived from an acoustic energy splitter, or sequentially (differentially) modulate the same beam, of which portions are returned after each tap.

It is also possible to directly analyze the received signal from the transponder in a digital signal processor, avoiding many of the analog processing elements described above. Thus, a digital radio receiver may be implemented.

It is therefore an object of one embodiment of the invention to provide an acoustic wave identification transponder device, having a substrate, an electroacoustic transducer generating an acoustic wave in the substrate and a set of encoding elements disposed in a path of the acoustic wave for modifying the acoustic wave, having at least two reflective elements disposed in the acoustic path of the acoustic wave such that an acoustic path length of the acoustic wave on the substrate is longer than twice a largest linear dimension of the substrate. Thus, the acoustic path is "folded" in a manner more complex than a simple reflection.

It is a further object of an embodiment of the invention to provide an acoustic wave identification transponder device employing trackchanger elements disposed within the acoustic path of the signal to efficiently redirect the acoustic energy.

It is also an object of an embodiment of the invention to provide an acoustic wave identification transponder device, having a substrate, an electroacoustic transducer generating an acoustic wave in the substrate and a set of encoding elements disposed in a path of the acoustic wave for modifying the acoustic wave, and an acoustic path on the substrate having at least two angles, having angle magnitudes whose sum exceeds $\pi$ radians. In this manner, the sum of the magnitudes of all the angles of acoustic reflection is at least 180°.

It is a further object of another embodiment according to the present invention to provide an acoustic wave identification transponder having an acoustic path which provides sequential portions of the single path adjacent to one another.

It is a still further object of an embodiment according to the present invention to provide an acoustic wave identification transponder having an angled elongated conductor having means for reflecting the acoustic wave to follow a path defined between portions of the angled elongated conductor. In this way, an electroacoustic transducer may be formed between adjacent portions of the path. Further, multiple electroacoustic transducers may be disposed in a common portion of the acoustic path.

It is also an object of an embodiment according to the present invention to provide an acoustic wave identification transponder having a spiral or zigzag acoustic in which a single acoustic wave is reflected back along its incident path. The reflective structures may be complete or partially reflective, allowing a portion of the acoustic wave to pass.

It is also an object of an embodiment of the present invention to provide an acoustic wave identification transponder having a plurality of structures disposed to selectively reflect respective portions of the acoustic wave back along its incident path, the respective portions having differing delay timings.

It is also an object of an embodiment according to the present invention to provide an acoustic wave identification transponder having a plurality of partially reflective structures, disposed sequentially along the acoustic path, to reflect a first portion of the acoustic wave and transmit a second portion the acoustic wave to another partially reflective structure. The reflected first portion may be at an angle different than 180° from the incident acoustic wave, for example at an angle of approximately 90° from the incident acoustic wave.

It is also an object an embodiment of the invention to provide an acoustic wave identification transponder having at least one electroacoustic transducer being associated with an acoustic path, having a plurality of partially reflective structures, disposed sequentially along the acoustic path, to reflect a first portion of the acoustic wave and transmit a second portion the acoustic wave to another partially reflective structure along the acoustic path, the acoustic path being subject to at least two substantially reflecting structures to redirect the acoustic path.

It is also an object of an embodiment of the invention to provide an acoustic wave identification transponder having a plurality of partially reflective structures, disposed sequentially along the acoustic path, to reflect a first portion of the acoustic wave and transmit a second portion the acoustic wave to an adjacent partially reflective structure, the reflected first portion being further directed toward a structure which reflects the acoustic wave back along its incident path.

It is also an object of an embodiment of the invention to provide an acoustic wave identification transponder having a structure is disposed along at least one portion of the acoustic path, the structure having reduced acoustic wave propagation velocity as compared to a portion of the substrate absent the structure.

It is also an object of an embodiment of the invention to provide an acoustic wave identification transponder having a plurality of structures are disposed along portions the acoustic path, the structures having reduced acoustic wave propagation velocity as compared to a portion of the substrate absent the structures, the structures having a relative disposition to provide a differing delay to respective portions of the acoustic wave.

It is also an object of an embodiment of the invention to provide an acoustic wave identification transponder having an angled elongated conductor which follows a piecewise helical path around a periphery of the substrate.

It is also an object of an embodiment according to the present the invention to provide an acoustic wave identification transponder having an acoustic wave which is directed along an acoustic path by corner reflectors.

It is also an object of an embodiment according to the present invention to provide an acoustic wave identification transponder, wherein the substrate is a piezoelectric substrate, the acoustic wave being directed along the acoustic path by electroacoustic transducing structures.

It is also an object of an embodiment according to the present invention to provide an acoustic wave identification transponder having a plurality of structures are disposed along portions the acoustic path, the structures having reduced acoustic wave propagation velocity and an acoustic wave specific attenuation which differs from a portion of the substrate absent the structures, the structures having a relative disposition to provide a differing delay and differing attenuation to respective portions of the acoustic wave.

It is also an object of an embodiment according to the present invention to provide an acoustic wave identification transponder having an angled elongated conductor which is provided such that adjacent portions have a relative phase difference of a radio frequency signal induced therein. The cosine of the relative phase delay is preferably greater than about 0.5.

It is also an object of an embodiment according to the present invention to provide an acoustic wave identification transponder having an acoustic path which comprises a plurality of portions, each portion being adapted for selective modification with a differing combination of phase delay and amplitude alteration, the combination defining the encoding elements, further comprising means for combining the portions of the acoustic path to produce a composite modified acoustic wave. The differing combination of phase delay and amplitude alteration may approximate, for example, a QAM encoding scheme, and may be, e.g., a QAM-16, QAM-18 encoding Polar Modulation scheme, or other regular or irregular signal constellation pattern in phase-amplitude space, with or without missing code modulation spaces. It is noted that a QAM-18 encoding scheme preferably does not employ amplitude weighting pads, and therefore the delay pads occupy the full beam width.

If there are a series of reflectors in the same acoustic path, and the acoustic path to the first reflector has been modified in amplitude and phase due to a triplet (or the like), then immediately after that reflector, a complementary phase pad structure may be provided to compensate the beam across the beam width, and realign the respective phases of portions of the beam across its width, thus restoring the beam to phase parity across its width. On applying a second encoding means to encode the second reflection, commonality between the overall phase shift of the compensator and the new coding can be considered. In other words, it is sought to compensate a reflection of the beam from a successive beam encoding element, rather than compensating the wave front itself. Therefore, the compensation elements for a prior stage and encoding elements may be combined, to produce a net desired effect. This technique, therefore, is analytically similar to non-return to zero encoding (NRZ), which encodes successive symbols of an information stream differentially.

It is also an object of an embodiment according to the present invention to provide an acoustic wave identification transponder having an angled elongated conductor and having an antenna for receiving a radio frequency wave for inducing an electric field in the angled elongated conductor, and for reradiating an electric field in the angled elongated conductor as a radio frequency wave.

It is also an object of an embodiment according to the present invention to provide an acoustic wave identification transponder having an antenna for receiving a radio frequency wave for inducing an electric field in the angled elongated conductor, and for reradiating an electric field in the angled elongated conductor as a radio frequency wave and having an interrogator for generating a radio wave which is received by the antenna and for receiving the reradiated radio frequency wave, the interrogator being adapted to perform null steered polarization cancellation to differentiate between two acoustic wave identification transponder devices within the interrogation field.

It is also an object of an embodiment according to the present invention to provide an acoustic wave identification transponder having a conductor, an antenna for receiving a radio frequency wave for inducing an electric field in the conductor, and for reradiating an electric field in the conductor as a radio frequency wave and having an interrogator for generating a radio wave having a non-stationary frequency, which is received by the antenna and for receiving the reradiated radio frequency wave, the acoustic wave identification transponder device having a frequency-dependent response.

It is also an object of an embodiment according to the present invention to provide an acoustic wave identification transponder having a conductor, an antenna for receiving a radio frequency wave for inducing an electric field in the conductor, and for reradiating an electric field in the conductor as a radio frequency wave, wherein the acoustic wave transponder device emits in the radio wave a plurality of representations of the modified acoustic wave having differing delay.

These and other objects will become apparent from a review of the detailed description of the preferred embodiments.

BRIEF DESCRIPTION OF THE DRAWINGS

FIGS. 3A and 3B are time diagrams, drawn to different scales, of the radio frequencies contained in the interrogation and reply signals transmitted with the system of FIG. 1;

FIG. 4 is a block diagram illustrating the decoding process carried out by the signal processor in the system of FIG. 1;

FIG. 5 is a block signal diagram of a passive transponder which may be used with the system of FIG. 1;

FIG. 6 is a plan view, in enlarged scale, of a first configuration of the transponder of FIG. 5;

FIG. 7 is a plan view, in greatly enlarged scale, of a portion of the transponder configuration shown in FIG. 6;

FIGS. 9A–9C show an information cell in time and frequency space, an array of information cells in time and frequency and an array of information cells in time only, respectively;

FIGS. 10A and 10B show modulation patterns in phase-amplitude space for a QAM-16 and QAM-18 polar modulation, respectively;

FIGS. 15–18 show differing embodiments of acoustic transponder tags according to the present/invention having a wrapped acoustic path;

FIGS. 22 and 23 show loss calculations for various RAC embodiments according to the present invention;

DETAILED DESCRIPTION OF THE PREFERRED EMBODIMENTS

Figure 1:
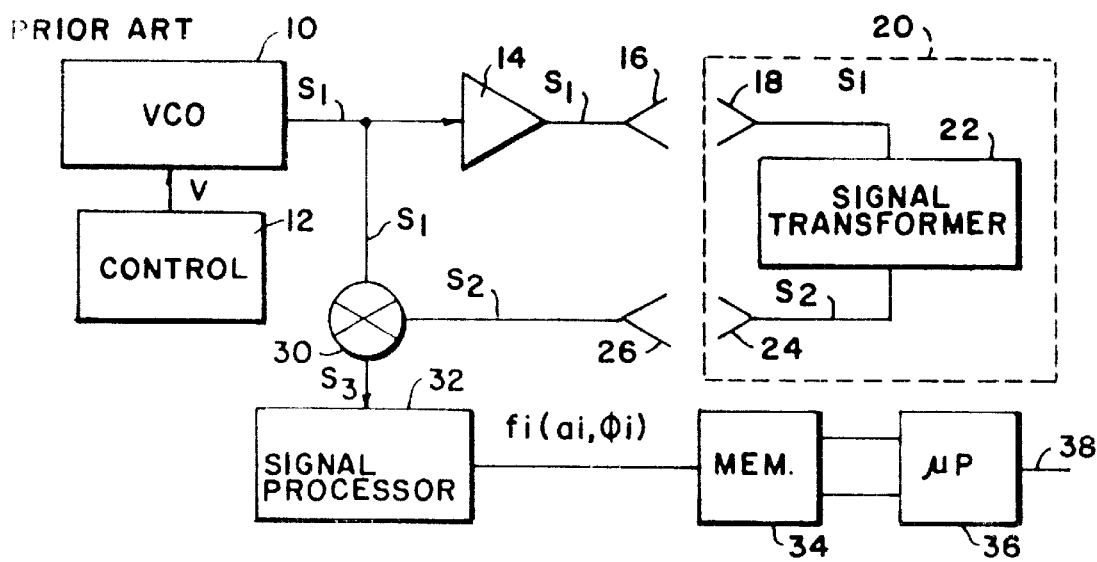
FIG. 1 is a block diagram of a known passive interrogator label system.
Figure 2:
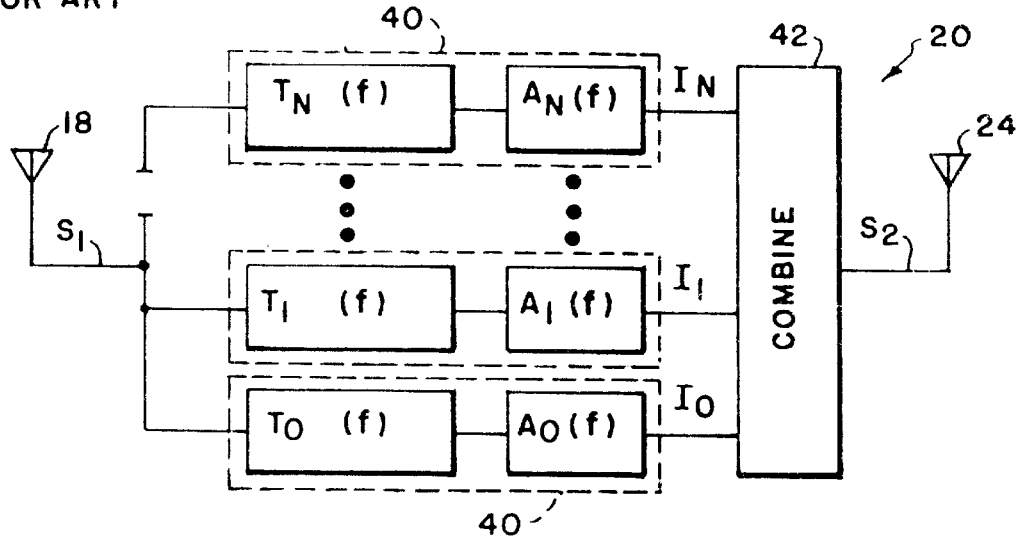
FIG. 2 is a block diagram of a transponder or "label" which is used in the system of FIG. 1.
Figure 3A:
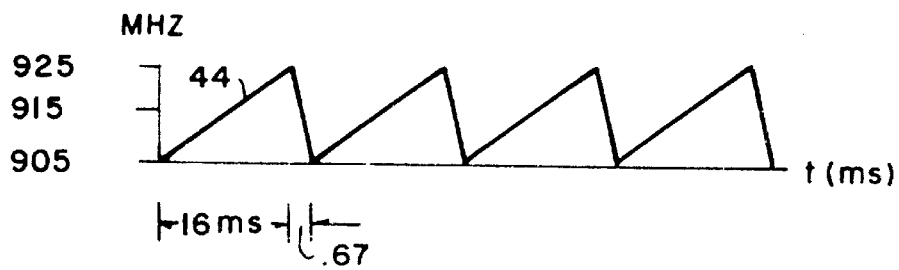
Figure 8A:
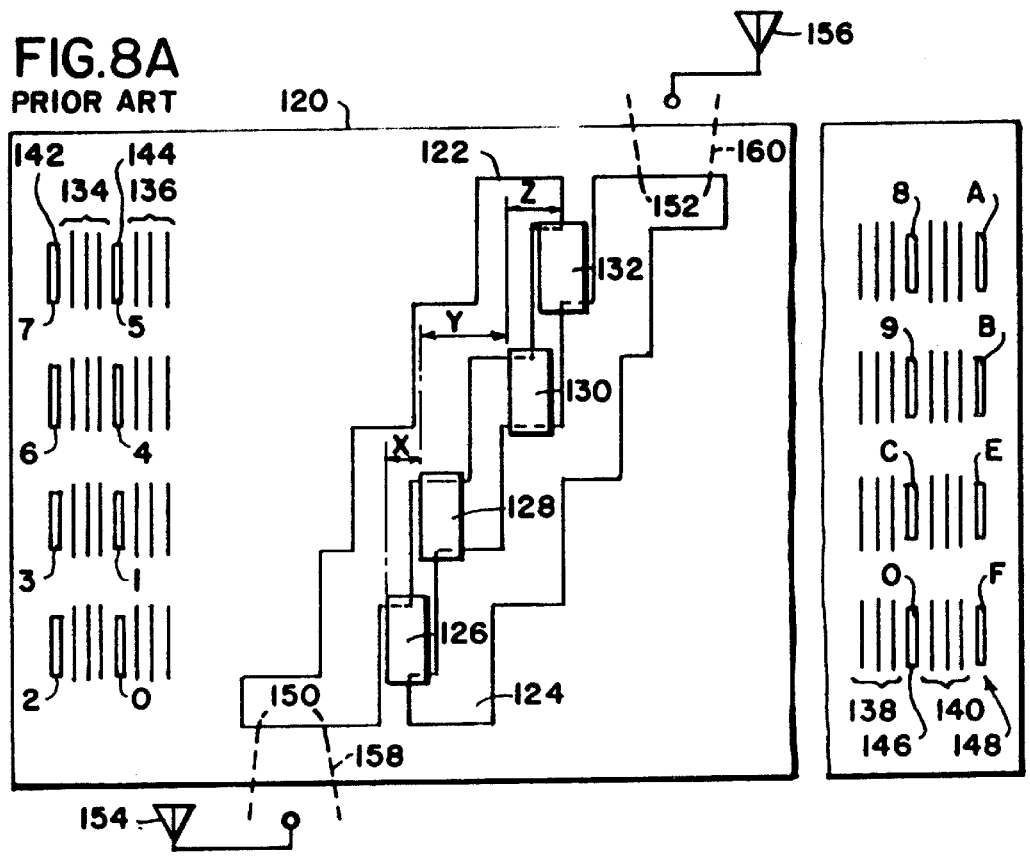
FIGS. 8A and 8B shows a prior art transponder having sets of parallel acoustic paths and reflective elements disposed along the acoustic paths.
Figure 8B:
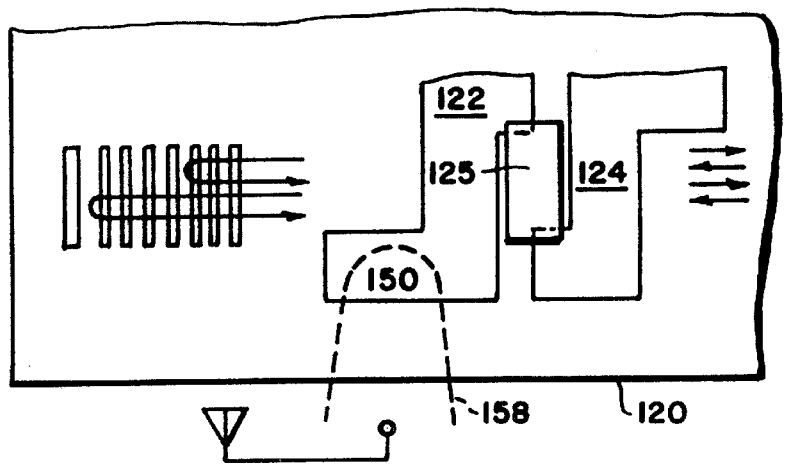

The preferred embodiments of the present invention will now be described with reference to the drawings. Identical elements in the various figures are designated with the same reference numerals.

EXAMPLE 1

FIG. 9 shows schematically various schemes for modulating information over a broadband signal. FIG. 9A shows a single information cell, which carries a minimum information packet. Within the scheme, information packets may be placed into differing modulation states over time and frequency, as shown in FIG. 9B. Alternately, information packets may be distributed over time only, as represented in FIG. 9C. Table 1 provides a mathematical analysis of the information packets of an acoustic transponder and limitations on the ability transmit encoded tag information.

EXAMPLE 2

FIGS. 10A and 10B show constellation patterns of quadrature amplitude modulation patterns (QAM), in this case QAM-16 and QAM-18 polar modulation. These patterns demonstrate the separation of modulation states by varying phase and amplitude of a signal. Various QAM constellation exist, including rectangular, polar, elliptic, irregular, and those with incomplete code sets. For example, in the QAM-18 scheme, the 0-phase, 0-amplitude code is unused according to the present invention.

EXAMPLE 3

Figure 11A:
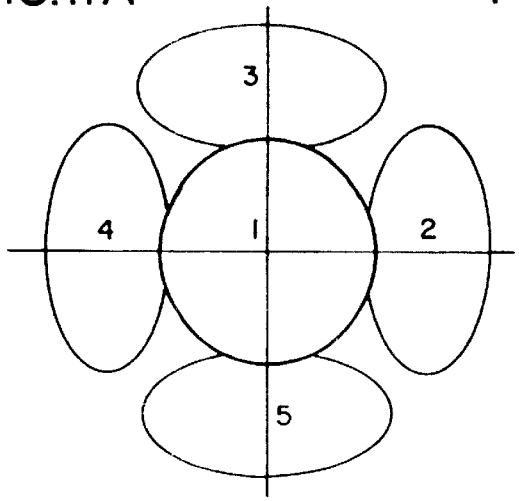
FIGS. 11A–11C show beam coverage using a patch antenna, polarization axes and a representation of multiple readers reading a single tag, respectively.
Figure 11B:
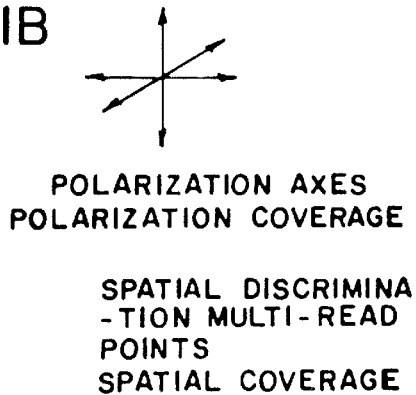
Figure 11C:
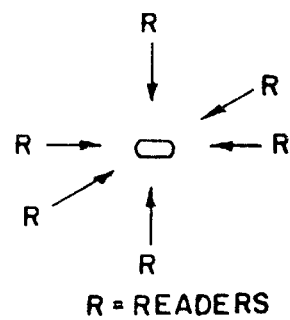

FIGS. 11A–11C show a beam coverage pattern for a patch-like antenna, polarization axes and potential for spatial discrimination of a tag. By providing lobular and polarized radio frequency transmission patterns, tags in proximity to an interrogation system may be distinguished. For example, where two tags have slightly differing orientations within the interrogation field, a null steered polarization technique may be used. In this case, one transponder produces a substantial output while another transponder is at a "null" or relatively low output level. This may be achieved by differential phase delays, group delays, or frequency responses, for example. Active phased array antennas may also be employed. As an example of this is, a unique set of three different delays associated with any one tag may be provided. Similar diversity may also be proposed in the frequency domain.

The polarization null steering relies on the assumption that each tag has been randomly placed on the article to be identified. The interrogator then excites the environment with two orthogonal linear polarized RF beams. All tags will respond to some degree in the two polarizations. If an algorithm is used where the two orthogonal components are combined vectorially to achieve at one moment some particular polarization, then the response will be that due to the assembly of all the tags. If the vector is now rotated, for example, by 5 degrees and the new resultant determined, then if one of the tags happens to fall in the null so created then there will be a substantial difference been the new resultant and the previous resultant where the difference will be the value of the tag just pulled out. All other tags will only change slowly in their level since they are presumably not near their individual null.

Figure 12A:
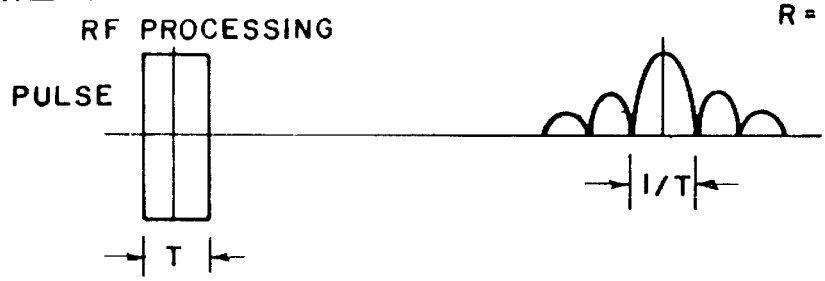
FIGS. 12A–12D show a representation in time and frequency of a pulse, a chirp, and a weighted chirp impulse, respectively.
Figure 12B:
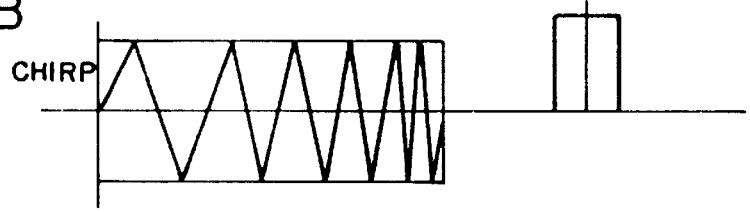
Figure 12C:
Figure 12D:
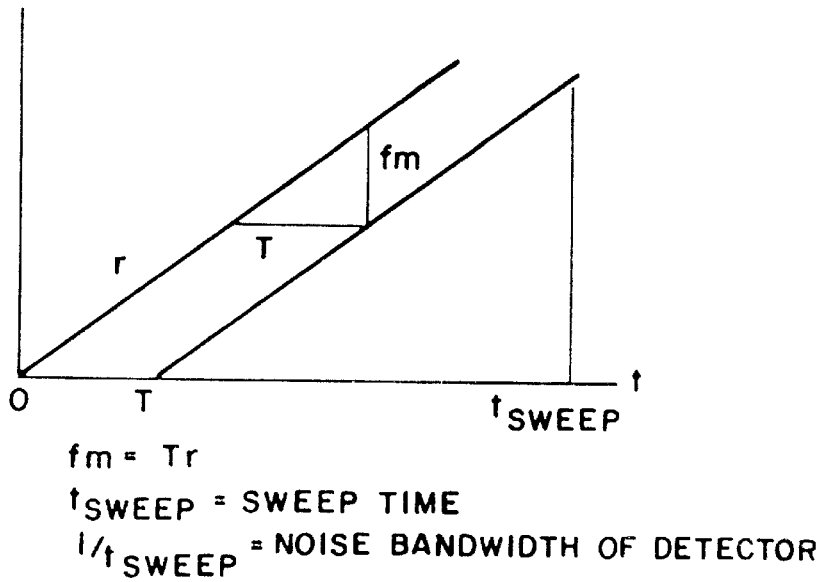
Figure 13:
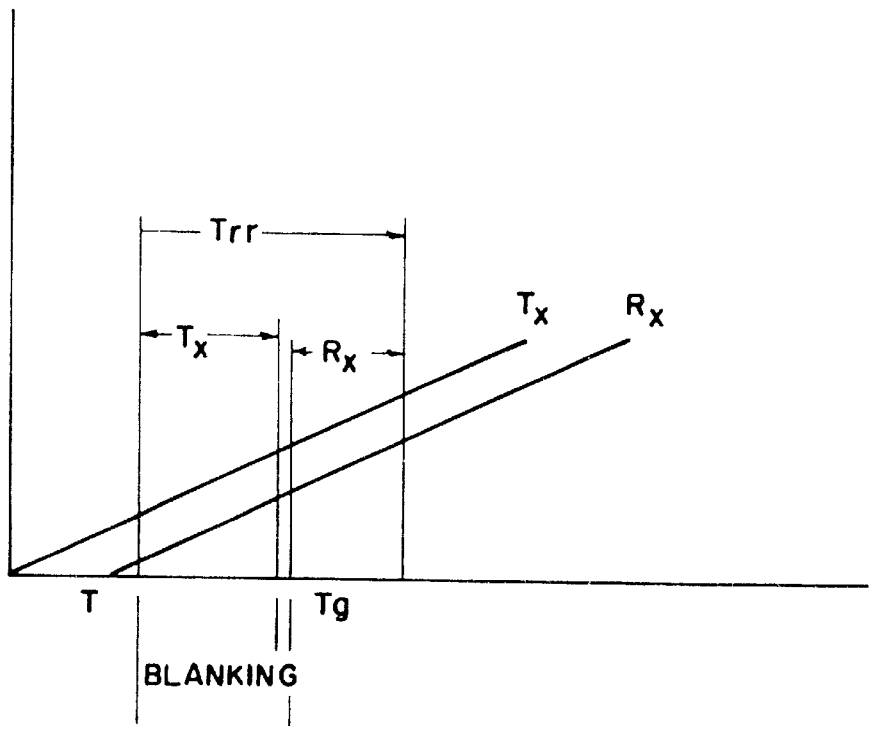
FIG. 13 shows a graph of superposed transmitted and received waveforms in frequency domain from an acoustic wave transponder.
Figure 14:
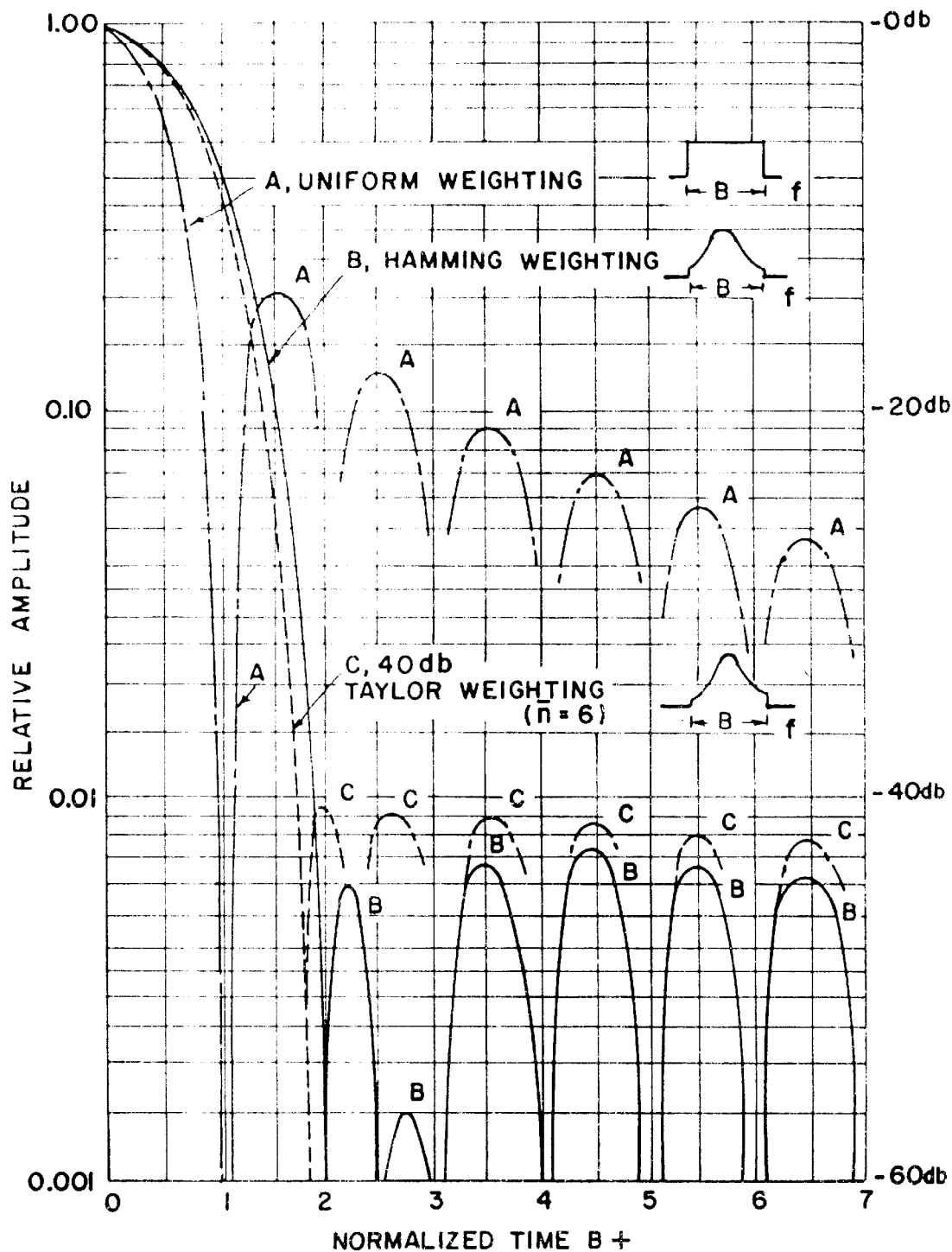
FIG. 14 shows a comparison of compressed pulse shapes for frequency weighting functions.
Figure 18:
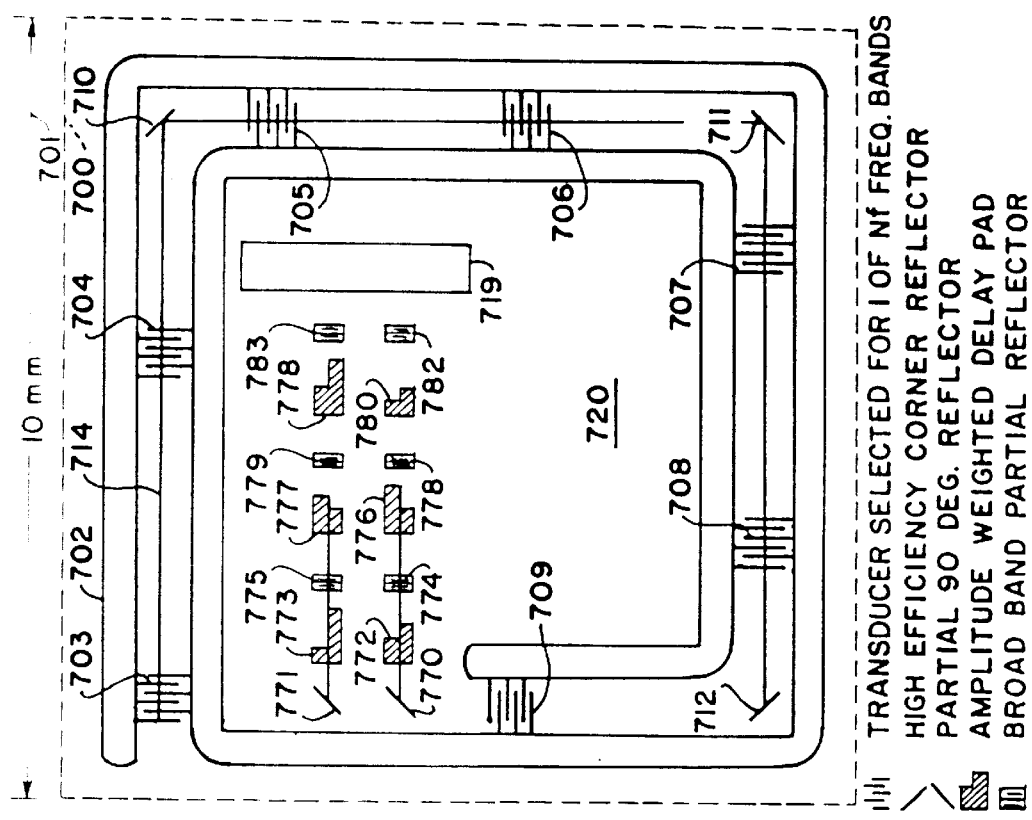
Figure 17:
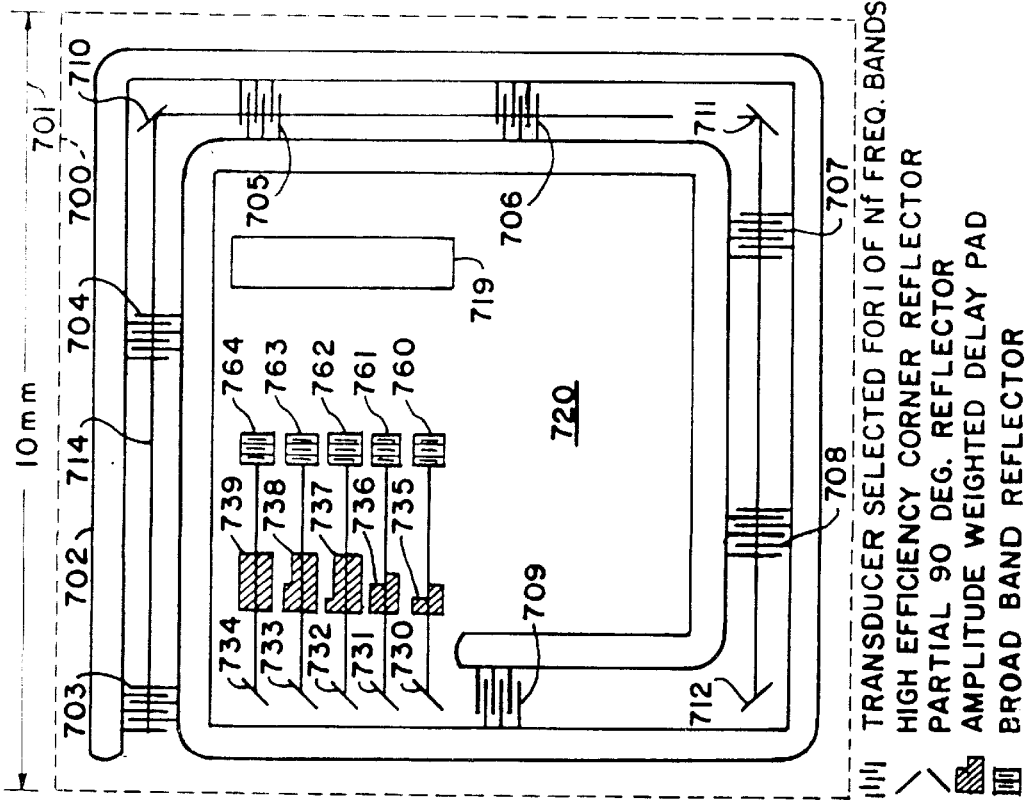

FIG. 12–12C show time and frequency domain representations, respectively, of a pulse, a chirp, and a shaped chirp. Based on these transformations, it is well known how to extract information modulated as delay factors from an information signal. FIG. 13 shows, more specifically, how a chirp waveform, assuming a delay in the transponder, allows separation of the transmitted and received information signals. FIG. 14 shows the effect of pulse shaping on the spectral characteristics of a signal. For example, Hamming weighting produces lower sidelobe amplitude than a uniform weighting, with Taylor weighting being intermediate.

EXAMPLE 4

FIGS. 15–18 show differing embodiments of the acoustic transponder tag according to the present invention. The thick dark line 702 represents the buss bar that drives the transducers 703, 704, 705, 706, 707, 708, 709. The bus bar 702 is laid out in the manner shown so as to enable the RF energy to be inductively coupled into the buss bar 702. As the buss bar 702 passes around the square substrate 700, having a side length of about 10 mm, for the second time it provides the means of driving the transducer 703, 704, 705, 706, 707, 708, 709 located at that respective location with the appropriate differential signal. Each transducer 703, 704, 705, 706, 707, 708, 709 so placed will split the available RF power equally in accord with the number of transducers. This same power loss will be sustained again on the reflected path, i.e. the overall loss due to the split will be 20 log(N). Table 2 provides, in more detail, an analysis of the signal strength of the received signal. Hence the number of transducers should be minimized to maintain high signal amplitudes. The energy, once launched from the transducers 703, 704, 705, 706, 707, 708, 709 will follow the acoustic path 714, indicated as a dotted line, around, reflecting 90 degrees at each corner 710, 711, 712, 713 (FIG. 15) until it reaches the partial reflectors 730, 731, 732, 733, 734, 770, 771 shown in FIGS. 16–18, where the energy will be split evenly into several parallel acoustic paths. In FIG. 35, no partial reflectors are provided and the acoustic paths are thus superposed. At this location the individual tag code is determined. The amplitude weighted delay pads 715, 717, 721, 723, 725, 727, 735, 736, 737, 738, 739, 772, 773, 776, 777, 780, 781 independently shift the phase and attenuate the acoustic energy. The Acoustic energy is reflected off sets of reflectors, which may be broadband 716, 718, 722, 724, 726, 728, 760, 761, 762, 763, 764, 774, 775, 778, 779, 782, 783 or frequency selective 740, 741, 742, 743, 744, 745, 746, 747, 748, 749. Each set of reflectors in any one path is identical to all the others. Any unreflected energy is absorbed in the absorber 719 shown. The acoustic energy then re-travels the path by which it came finally re-exciting the transducers 703, 704, 705, 706, 707, 708, 709 and hence the buss bar 702, thus finally inductively coupling back into the antenna structure (not shown). The delay and signal loss from a surface acoustic wave transponder system are analyzed in more detail in Table 3.

The code is uniquely determined in the code section 720 and then replicated in the time domain depending on which transducers 703, 704, 705, 706, 707, 708, 709 are selected to remain on the structure. Similarly the code is replicated in the frequency domain depending on which reflectors 716, 718, 722, 724, 726, 728, 760, 761, 762, 763, 764, 774, 775, 778, 779, 782, 783, 740, 741, 742, 743, 744, 745, 746, 747, 748, 749 are selected to remain. It is assumed that reflectors of the same frequency will be selected the same for all the split acoustic paths.

While the structure in the code section is of critical dimensions, the placement of the transducers is not critical, and therefore nominal positioning is sufficient. Selection of the transducers and reflectors is achieved by selective etching of the unwanted component, in a secondary processing operation.

EXAMPLE 5

Figure 19A:
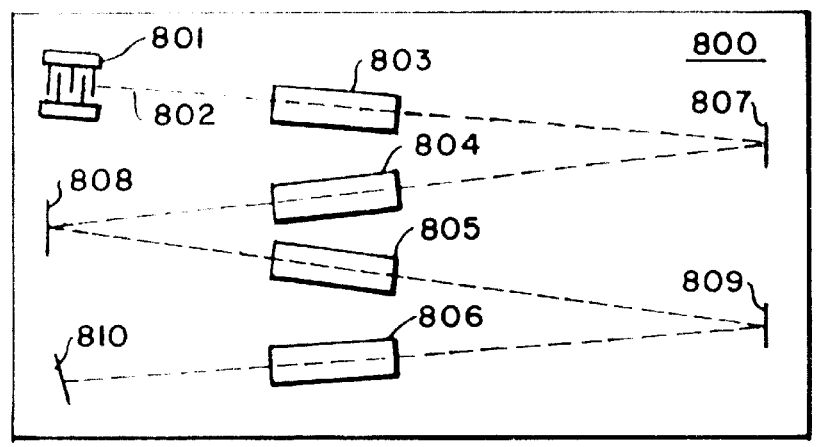
FIGS. 19A–19C show differing embodiments of the acoustic transponder tags according to the present invention having a multiply reflected path.
Figure 19B:
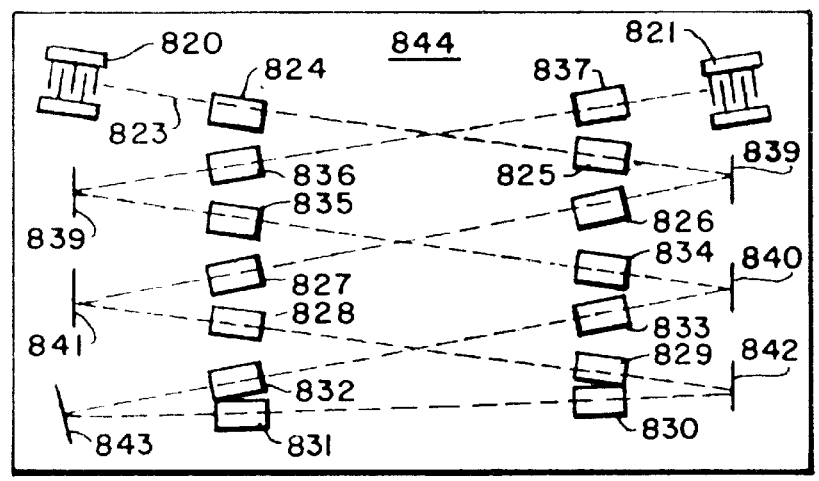
Figure 19C:
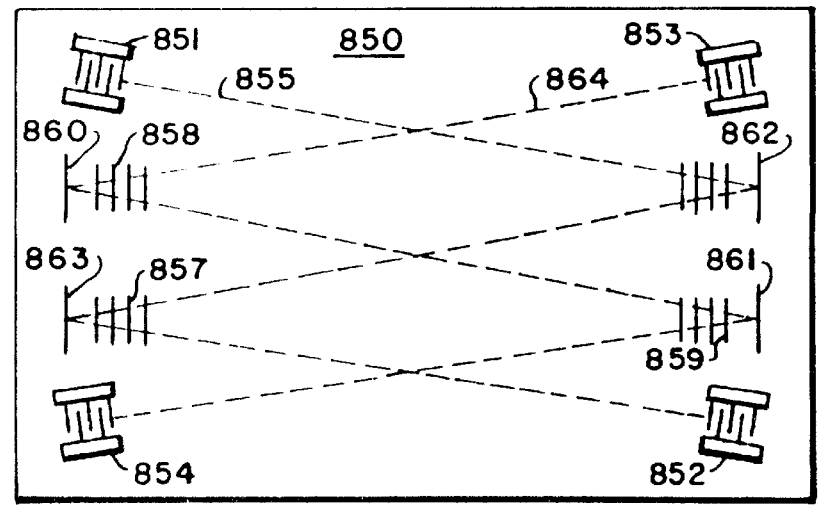

FIGS. 19–19C show an embodiment of the invention employing folded acoustic paths. FIG. 19A provides a single transducer 801 on substrate 800 producing acoustic wave 802. Acoustic wave 802 encounters sets of wave perturbation elements 803, 804, 805, 806 along its path, which impart a characteristic encoding. Between respective sets of wave perturbation elements 803, 804, 805, 806 are reflectors 807, 808, 809, 810 respectively, which direct the acoustic wave 802 along a desired path. Reflective element 810 redirects the wave along its incident path.

FIG. 19B is similar in concept to FIG. 19A, except the acoustic wave is directed to a different transducer. Thus, transducers 820, 821 are each provided on substrate 844. Acoustic wave 823 is directed between the two transducers 820, 821, guided by reflective elements 838, 839, 840, 841, 842, 843. Sets of wave perturbation elements 824, 825, 826, 827, 828, 829, 830, 831, 832, 833, 834, 835, 836, and 837 produce a characteristic encoding of the acoustic wave 823.

FIG. 19C is similar to FIGS. 19A and 19B, but provides a plurality of acoustic paths. Transducers 851 and 852 form one acoustic path 855, and transducers 853 and 854 form another acoustic path 864. Acoustic path 855 encounters reflective elements 862 and 863, as well as sets of wave perturbation elements 856 and 857 which produce a characteristic encoding. Likewise, acoustic path 864 encounters reflective elements 860 and 861, as well as sets of wave perturbation elements 858 and 859 which produce a characteristic encoding.

EXAMPLE 6

Figure 20:
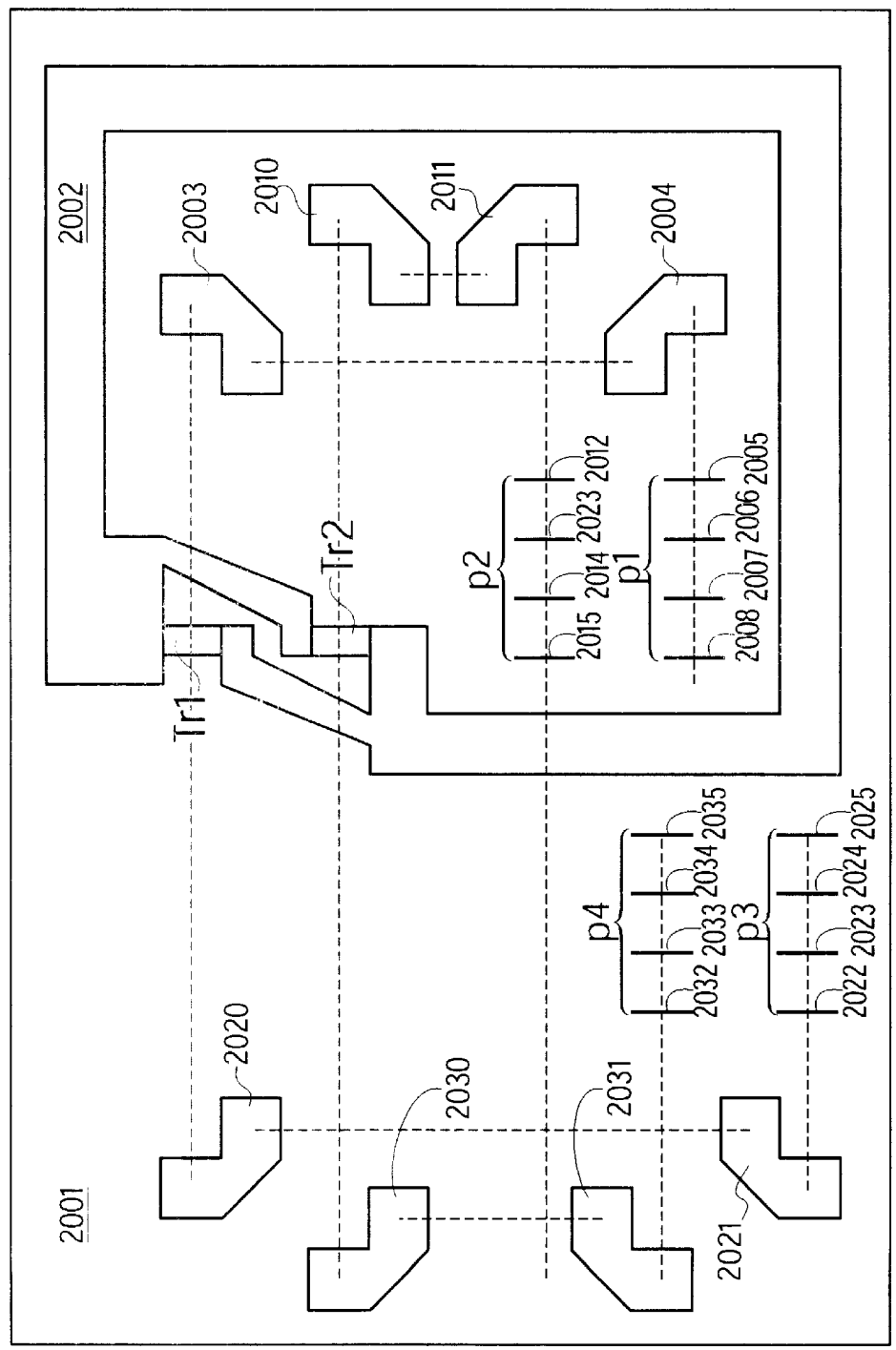
FIG. 20 shows a dual transducer trackchanger embodiment according to the present invention.

As shown in FIG. 20, trackchangers may be employed to define an acoustic path which is bent or folded. The configuration shown in FIG. 20 shows a semi-optimized design for a four path layout. The elements are provided as aluminized elements on a lithium niobate substrate 2001, operating in the 900 MHz band. Minimum delay is approximately 2.3 microseconds, with 100 nS between the taps of paths p1, p2, p3, p4. Separation between taps in each path p1, p2, p3, p4 is 200 ns, so as to give ample room for phasepads. The design provides two bidirectional transducers Tr1, Tr2, connected in parallel with the antenna loop 2002. The first acoustic path begins at transducer Tr1, toward trackchanger 2003, where it is redirected toward trackchanger 2004, from which it is further redirected toward taps 2005, 2006, 2007, and 2008 of path p1. The second acoustic path begins at transducer Tr2, toward trackchanger 2010, where it is redirected toward trackchanger 2011, from which it is further redirected toward taps 2012, 2013, 2014, and 2015 of path p2. The third acoustic path begins at transducer Tr1, toward trackchanger 2020, where it is redirected toward trackchanger 2021, from which it is further redirected toward taps 2022, 2023, 2024, and 2025 of path p3. The fourth acoustic path begins at transducer Tr2, toward trackchanger 2030, where it is redirected toward trackchanger 2031, from which it is further redirected toward taps 2032, 2033, 2034, and 2035 of path p4. The relative delay between the return of signals from the paths is p2, p1, p4 then p3. Not shown in FIG. 20 are other known elements of a passive surface acoustic wave transducer, such as compensation elements.

Taps 2005, 2006, 2007, 2012, 2013, 2014, 2022, 2023, 2024, 2032, 2033, and 2034 include a semireflective acoustic element, returning a portion of the acoustic energy back along its incident path toward a respective transducer. Taps 2008, 2015, 1025, and 2035 are designed to be maximally reflective, to provide maximum efficiency for return of the acoustic wave, and to avoid spurious waves. Each of the taps, in this case, may be a known type of phase encoding. Therefore, in this case, each respective tap includes a reflective or semireflective element and 0, 1, 2 or 3 phase delay pads. As noted below, other encoding schemes may also be employed.

The antenna loop 2002 is designed in known manner to reduce edge reflection effects. Estimated size of the lithium niobate substrate 2001 die is 4.9×7.5 mm. The length of the die could be reduced further by folding certain paths around and below the antenna loop. However, this would increase the width quite substantially, so that the total die size would be somewhat larger; at the same time, the minimum delay would also be increased substantially. If we estimate a loss of 3 dB (two-way) per multistrip trackchanger, an average propagation loss of 3 dB and an antenna-transducer matching loss of 2 dB (two-way), the total loss per tap should be (see Table I) 31+6+3+2−1=41 dB.

One type of phase pad coding scheme, which employs partial beam width phase delay pads, may be employed to result in a net phase and amplitude change for the beam. For each delay element, three types of pads are provided; a full beam width π/6 pad (60 degrees, for 6 dB reduction), a half-beam width π/3 pad (120 degrees, for 0 dB reduction), and a full beam width π/4 pad (90 degrees, for normal phase modulation). Adding such amplitude modulation to the four path layout described herein, will increase the die length by approximately 0.5 mm.

The die size for an available surface acoustic wave transponder device, available from XCyte, Inc., San Jose, Calif., is approx. 4.4 mm×8.2 mm=36.1 mm$^2$ (t0=0.6 microseconds). In a four path trackchanger embodiment according to the present example with phase modulation only, the design would consume approximately 4.9×7.5= 36.8 mm$^2$ (t0=2.3 microseconds). In a four path trackchanger with amplitude weighting according to the present embodiment, the design would consume 4.9×8=39.2 mm$^2$ (t0=2.45 microseconds). In a two path trackchanger according to the present embodiment (single transducer with eight taps), the design would consume 6.5×7.5=48.8 mm$^2$ (t0=2.7 microseconds)

EXAMPLE 7

Figure 21:
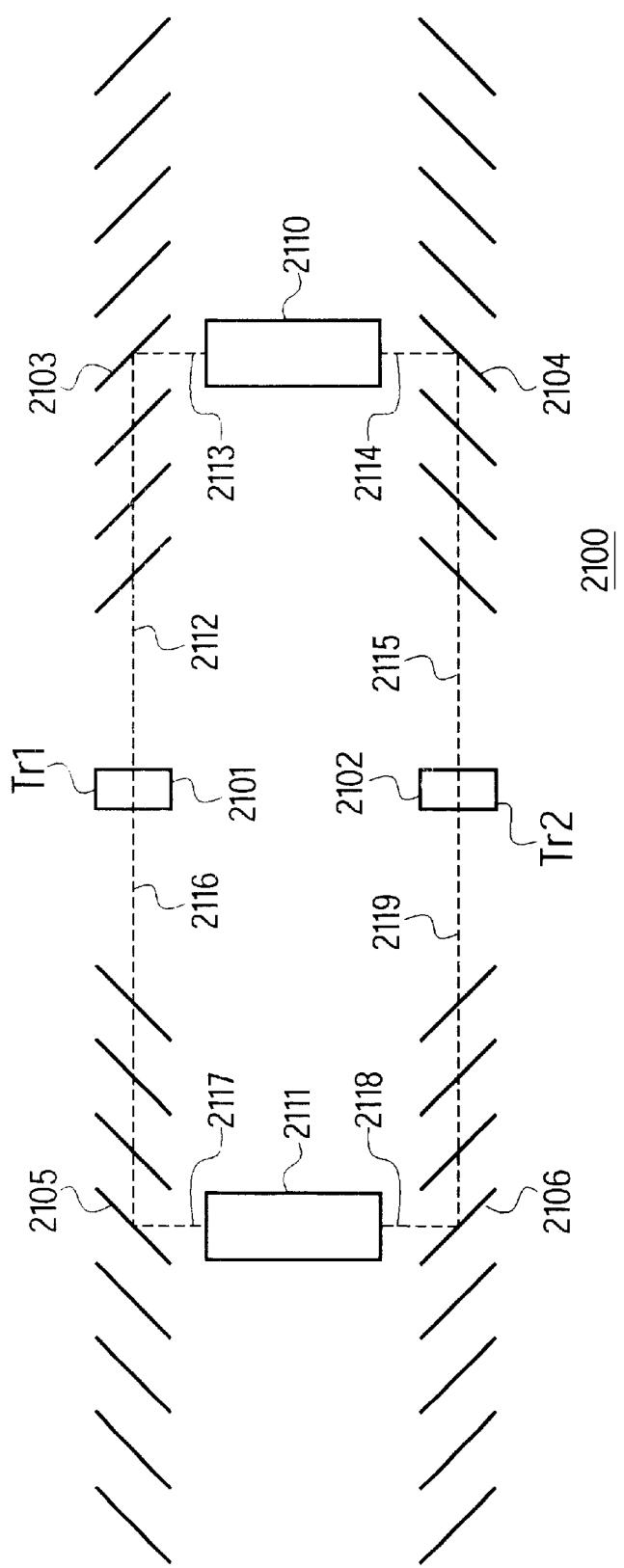
FIG. 21 shows a schematic diagram of a reflective array compressor (RAC) embodiment according to the present invention.

A reflective array coupled (RAC) filter configuration offers the possibility of lower insertion loss with low multipath distortions. In such a system, shown schematically in FIG. 21, a series of semireflective elements, e.g., 2103, 2105 inclined to the axis of wave propagation, e.g., 2112, 2116 from the transmitting transducer 2101, are disposed along the acoustic path, each acting to reflect portions of the acoustic wave, e.g., 2113, 2117. Each element of the array defines a separate acoustic path having a separate characteristic delay. Encoding elements, e.g., 2110, 2111 are disposed along each of the separate acoustic paths after the semireflective element, e.g., 2103, 2105. Another corresponding array of semireflective elements, e.g., 2104, 2106 is provided after the encoding elements, e.g., 2110, 2111, along the acoustic paths, to compress the widened acoustic beam, which is then directed toward a receiving transducer 2102. This arrangement may be modified by replacing the receiving reflective array, e.g., 2103, 2105, with a high efficiency reflector, which reflects the acoustic wave portions back along their incident path, to the transmitting transducer 2101. Alternately, the acoustic path may be formed to reintroduce the acoustic signal to the rear of the transducer, or to split the acoustic signal to reintroduce it to the front of the transducer. Without additional trackchangers, the die size will be considerably larger than those discussed above. However, all coding in this design can take place in the "vertical" (x) crystal direction. The coupling in this case is reduced by approximately a factor of three compared to the z-direction, which requires more space for coding. However, with an increased pedestal delay to this represents no problem. Two factors are of primary concern:

With up to 16 beam deflectors acting in cascade, a significant variation of reflectors in each deflector needs to be designed in to obtain a reasonable uniformity in tap amplitudes; and Each deflector needs to be designed so as limit the influence of second order reflections which cause a spurious multipath signal.

The amplitude of the signal reflected off the deflectors may be described by (tap n):

$$a(n)=[r(n)]^2[t(n)]^2 t0^2$$

where r(n) is the reflection off deflector element n, t(n)= sqrt[1−r$^2$] and t0 is the propagation loss between taps. The next tap amplitude is given by:

$$a(n+1)=[r(n+1)]^2[1-r(n+1)^2]t0^2\ a(n)/[r(n)]$$

If we require that a(n+1)=a(n), a good approximation is:

$$rp(n+1)=rp(n)/[(1-rp(n))t0p]$$

where rp(n)=[r(n)$^2$].

Examples of reflector distributions and loss distributions for starting element reflections of 0.2 and 0.25, respectively is shown in FIGS. 22 and 23, developed using a Mathcad model.

Figure 24:
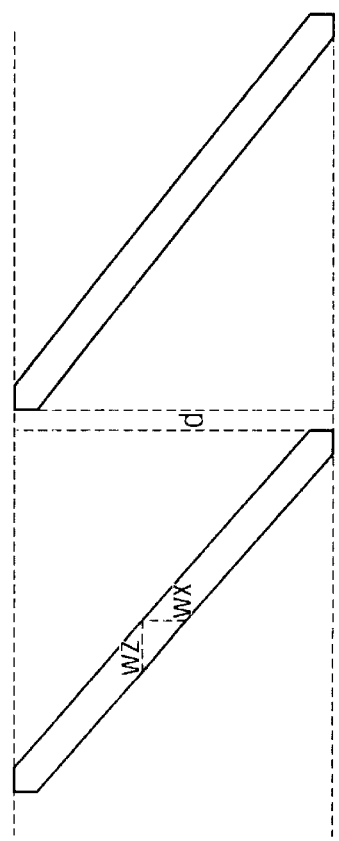
FIG. 24 shows a detail of individual reflective elements.

For the loss calculations, a first tap propagation loss of 1 dB has been added. In addition, there are transducer and matching losses. If we assume a matching loss of 1 dB, using 2 bi-directional transducers, we get:

For r=0.2 (~14 dB): I1=36 dB
For r=0.25 (~12 dB): I1=32.5 dB
An estimated die size is 10.1×6.3=63.6 mm$^2$ The element contains M reflector strips (one per wavelength in x an z directions), as shown in FIG. 24, such that the dimensions wz, wx are given by wz=M$\lambda$z, wx=M$\lambda$x The beam aperture is limited by allowing for some finite space d to avoid additional second order cross talk. For M=10–20, an aperture of approximately 90$\lambda$ should be reasonable, when the element separation is 100 ns (tap separation on each side=200 ns).

Reflection from one strip (shorting effect) is estimated to be approximately 0.015 in the z-direction and approximately 0.005 in the x-direction; yielding an average of 0.0125. If we assume that additional mass loading brings the total up to 0.022, the number of strips needed is:

M=0.25/0.022=11.4 for r=0.25 and
M=0.2/0.022=9.1 for r=0.2

Figure 25:
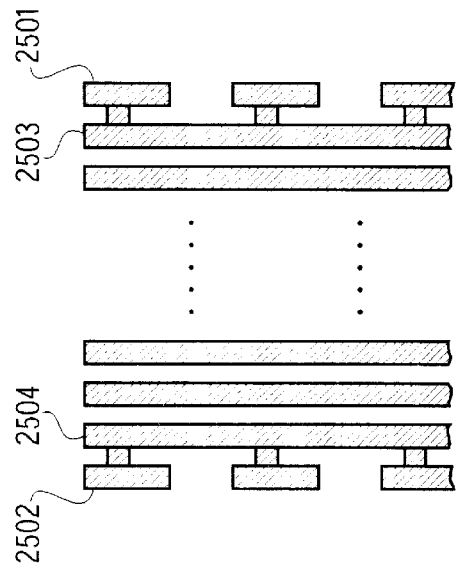
FIG. 25 shows an arrangement effectively providing a non-integral number of elements in a reflective strip.

In order to realize a fractional number of strips by providing a peripheral interrupted element 2501, 2502, bridged with an adjacent uninterrupted element 2503, 2504, as shown in FIG. 25.

Figure 26:
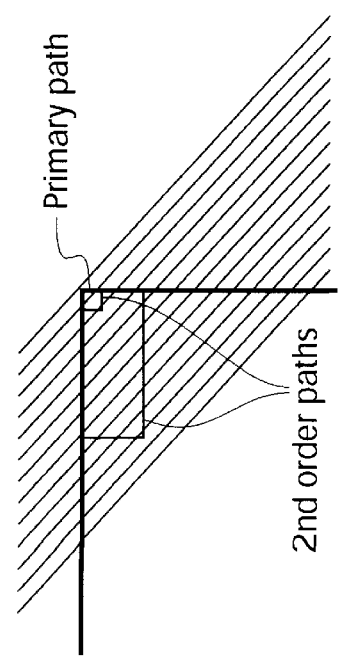
FIG. 26 schematically shows the generation of second order paths from an acoustic wave incident on a set of parallel strips.

Second order path signals interfering may interfere with the primary signal, as shown in FIG. 26. The number of contributions is in this case: M$^2$/2=72, which results in a spurious level of 72 re$^2$, or a total of approximately 144 re$^{2=0.07}$ for re=0.022.

Using the forgoing simplified analysis, it is apparent that an insertion loss (per tap) of 34 dB might be realizable for this reflective array compressor (RAC) configuration, resulting in a die size of approximately 10.1×6.3 mm$^2$.

Figure 27:
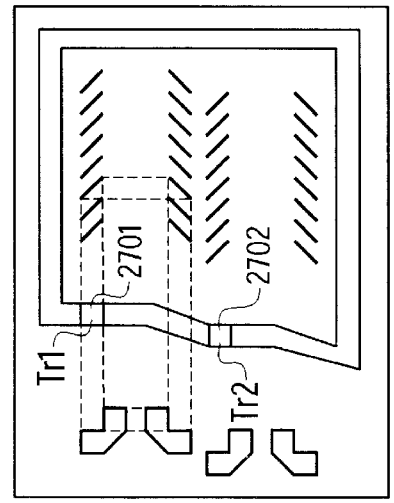
FIG. 27 shows a schematic representation of a RAC embodiment according to the present invention employing trackchangers.

By folding the paths through a 180 degree trackchanger; the die size may be reduced to approximately 6×9=54 mm$^2$ while the insertion loss would go up to approximately 40 dB. The layout is least cumbersome if two series coupled transducers 2701, 2702 are used, as shown in FIG. 27.

EXAMPLE 8

Figure 28:
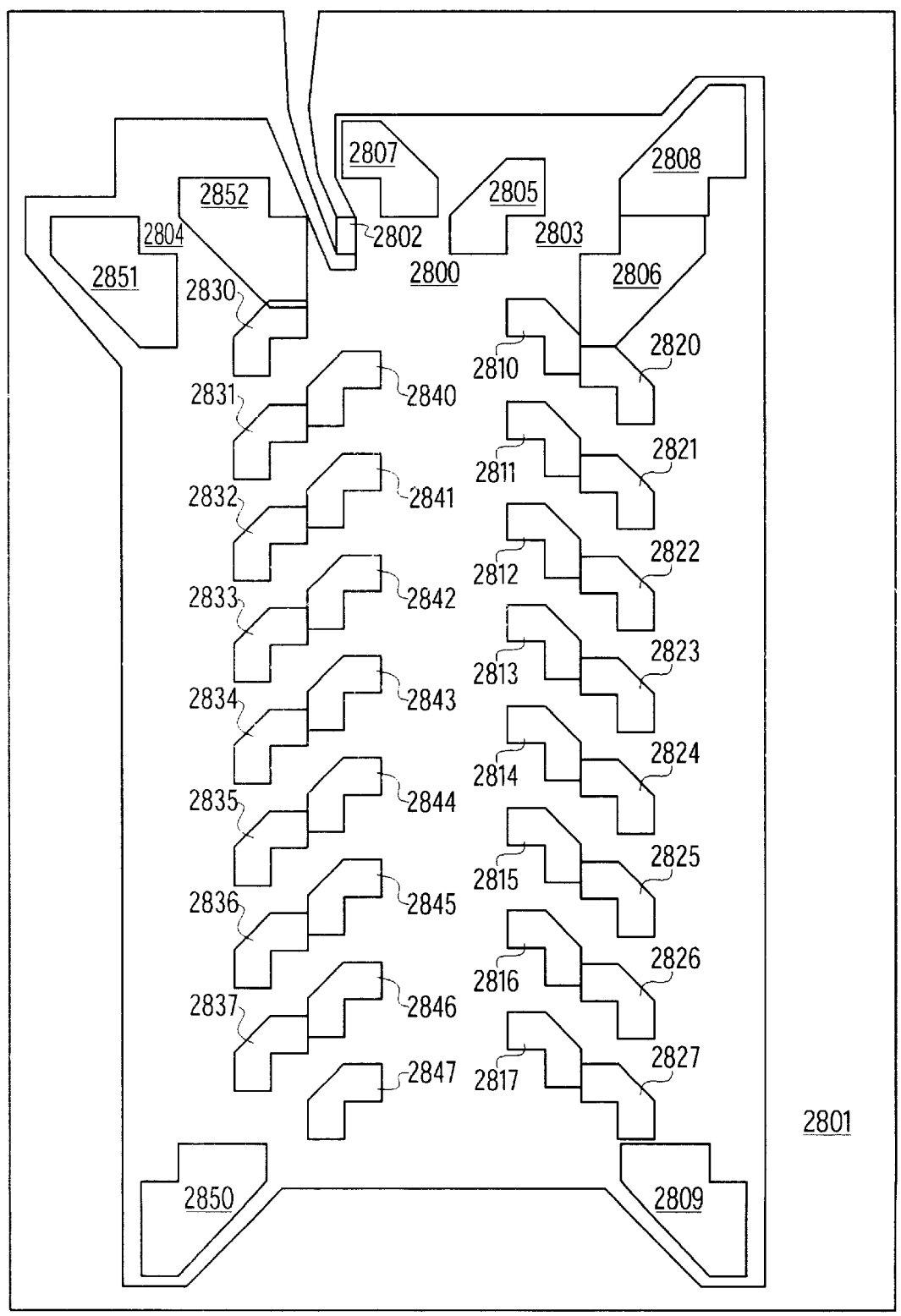
FIGS. 28, 29 and 30 show embodiments according to the present invention employing extensive use of trackchangers.

As shown in FIG. 28, the system need not be based on a helical conductor. Thus, a zigzag pattern, i.e., a pattern in which the acoustic wave travels back and forth over incrementally spaced path segments, may be provided. FIG. 28 shows a set of two offset and superposed sets of trackchangers, which are arranged to provide a central space suited for forming signal modifying elements. The acoustic wave thus is separated into a plurality of paths, each path interacting with a limited number of signal modifying elements. Due to the arrangement of trackchangers and the peripheral acoustic path, the acoustic signals from the distinct acoustic paths are non-temporally overlapping.

The antenna loop 2801 encircles the active region of the substrate 2800, with a transducer 2802 formed at a gap portion. The transducer 2802 has a forward 2803 and reverse 2804 acceptance path. The forward path intersects a low efficiency trackchanger 2805 and a high efficiency trackchanger 2806. By low efficiency, it is meant that, along at least one axis, the trackchanger absorbs only a portion of the incident acoustic energy. Typically, the trackchanger has nearly symmetric efficiency along both axes, relating to the number and nature of conductive elements used to fabricate the element.

The low efficiency trackchanger 2805 redirects a portion of the acoustic wave energy downward, while the remainder passes through to the high efficiency trackchanger 2806, which redirects the remainder of the acoustic wave energy downward. These two downward paths are respectively displaced and non-overlapping. The downward path from the low efficiency trackchanger 2805 intersects a linearly disposed array of further trackchangers 2810, 2811, 2812, 2813, 2814, 2815, 2816, 2817, which are also low efficiency (except possibly the terminal trackchanger in the array). These redirected acoustic wave paths pass through wave modification structures, such as phase delay pads or phase/amplitude modification pads, not shown in FIG. 28. The waves are received by a linearly disposed array of low efficiency trackchangers 2830, 2831, 2832, 2833, 2834, 2835, 2836, 2837, which redirect the incident energy upward, toward the trackchanger 2852. Trackchanger 2852 redirects the acoustic energy from all of the trackchangers 2830, 2831, 2832, 2833, 2834, 2835, 2836, 2837 at right angles to the right, toward trackchanger 2808, which, in turn redirects the acoustic energy around the periphery of the substrate 2800 (within the antenna loop 2801) to trackchanger 2809, trackchanger 2850, trackchanger 2851, and hence to the rear of transducer 2802.

The high efficiency trackchanger 2806 redirects the acoustic wave energy downward to intersect a linearly disposed array of further trackchangers 2820, 2821, 2822, 2823, 2824, 2825, 2826, 2827, which are low efficiency (except possibly the terminal trackchanger in the array), which redirect respective portions of the acoustic wave at right angles, to the left. These redirected acoustic wave paths pass through wave modification structures, such as phase delay pads or phase/amplitude modification pads, not shown in FIG. 28. The waves are received by a linearly disposed array of low efficiency trackchangers 2840, 2841, 2842, 2843, 2844, 2845, 2846, 2847, which redirect the incident energy upward, toward the trackchanger 2807. Trackchanger 2807 redirects the acoustic energy from all of the trackchangers 2840, 2841, 2842, 2843, 2844, 2845, 2846, 2847 at right angles to the right, toward trackchanger 2808, which, in turn redirects the acoustic energy around the periphery of the substrate 2800 (within the antenna loop 2801) to trackchanger 2809, trackchanger 2850, trackchanger 2851, and hence to the rear of transducer 2802.

It is noted that the transducer is bi-directional, and therefore, each of the acoustic paths has a respective forward and reverse component. However, since the characteristic delays are the same for forward and reverse paths, the net result is additive. It I also possible to make transducer 2802 unidirectional.

The resulting die is about 3.24 mm×4.78 mm, having an area of about 15.5 mm$^2$.

EXAMPLE 9

Figure 29:
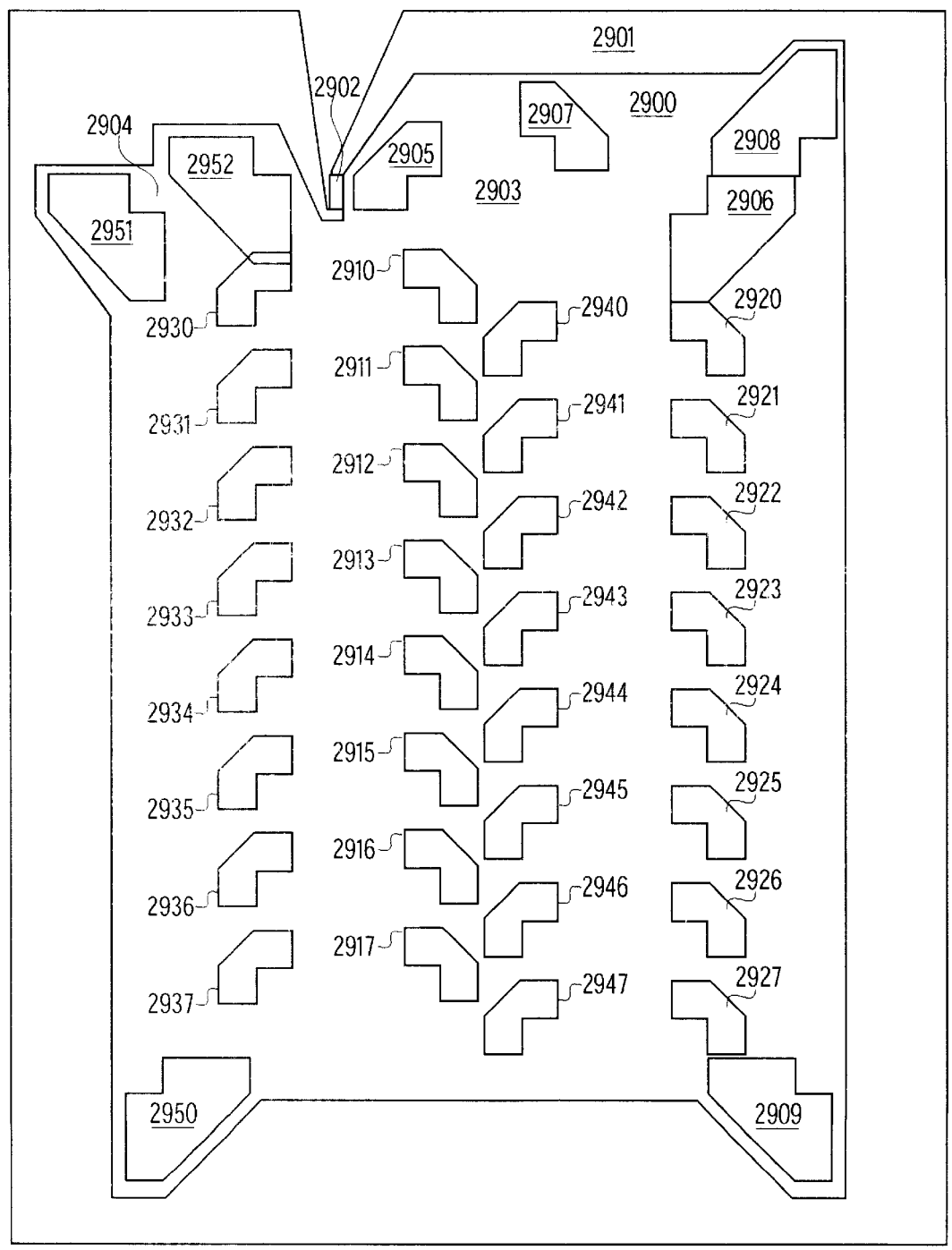

As shown in FIG. 29, the reflective arrays need not be superposed, as the embodiment shown in FIG. 28. The antenna loop 2901 encircles the active region of the substrate 2900, with a transducer 2902 formed at a gap portion. The transducer 2902 has a forward 2903 and reverse 2904 acceptance path. The forward path intersects a low efficiency trackchanger 2905 and a high efficiency trackchanger 2906.

The low efficiency trackchanger 2905 redirects a portion of the acoustic wave energy downward, while the remainder passes through to the high efficiency trackchanger 2906, which redirects the remainder of the acoustic wave energy downward. These two downward paths are respectively displaced and non-overlapping. The downward path from the low efficiency trackchanger 2905 intersects a linearly disposed array of further trackchangers 2910, 2911, 2912, 2913, 2914, 2915, 2916, 2917, which are also low efficiency (except possibly the terminal trackchanger in the array). These redirected acoustic wave paths pass through wave modification structures, such as phase delay pads or phase/amplitude modification pads, not shown in FIG. 29. The waves are received by a linearly disposed array of low efficiency trackchangers 2930, 2931, 2932, 2933, 2934, 2935, 2936, 2937, which redirect the incident energy upward, toward the trackchanger 2952. Trackchanger 2952 redirects the acoustic energy from all of the trackchangers 2930, 2931, 2932, 2933, 2934, 2935, 2936, 2937 at right angles to the right, toward trackchanger 2908, which, in turn redirects the acoustic energy around the periphery of the substrate 2900 (within the antenna loop 2901) to trackchanger 2909, trackchanger 2950, trackchanger 2951, and hence to the rear of transducer 2902.

The high efficiency trackchanger 2906 redirects the acoustic wave energy downward to intersect a linearly disposed array of further trackchangers 2920, 2921, 2922, 2923, 2924, 2925, 2926, 2927, which are low efficiency (except possibly the terminal trackchanger in the array), which redirect respective portions of the acoustic wave at right angles, to the left. These redirected acoustic wave paths pass through wave modification structures, such as phase delay pads or phase/amplitude modification pads, not shown in FIG. 29. The waves are received by a linearly disposed array of low efficiency trackchangers 2940, 2941, 2942, 2943, 2944, 2945, 2946, 2947, which redirect the incident energy upward, toward the trackchanger 2907. Trackchanger 2907 redirects the acoustic energy from all of the trackchangers 2940, 2941, 2942, 2943, 2944, 2945, 2946, 2947 at right angles to the right, toward trackchanger 2908, which, in turn redirects the acoustic energy around the periphery of the substrate 2900 (within the antenna loop 2901) to trackchanger 2909, trackchanger 2950, trackchanger 2951, and hence to the rear of transducer 2902.

The resulting die is about 3.73 mm×4.68 mm, having an area of about 17.5 mm². The minimum delay is 3.5 $\mu$S, while the maximum delay is 5.6 $\mu$S.

EXAMPLE 10

Figure 30:
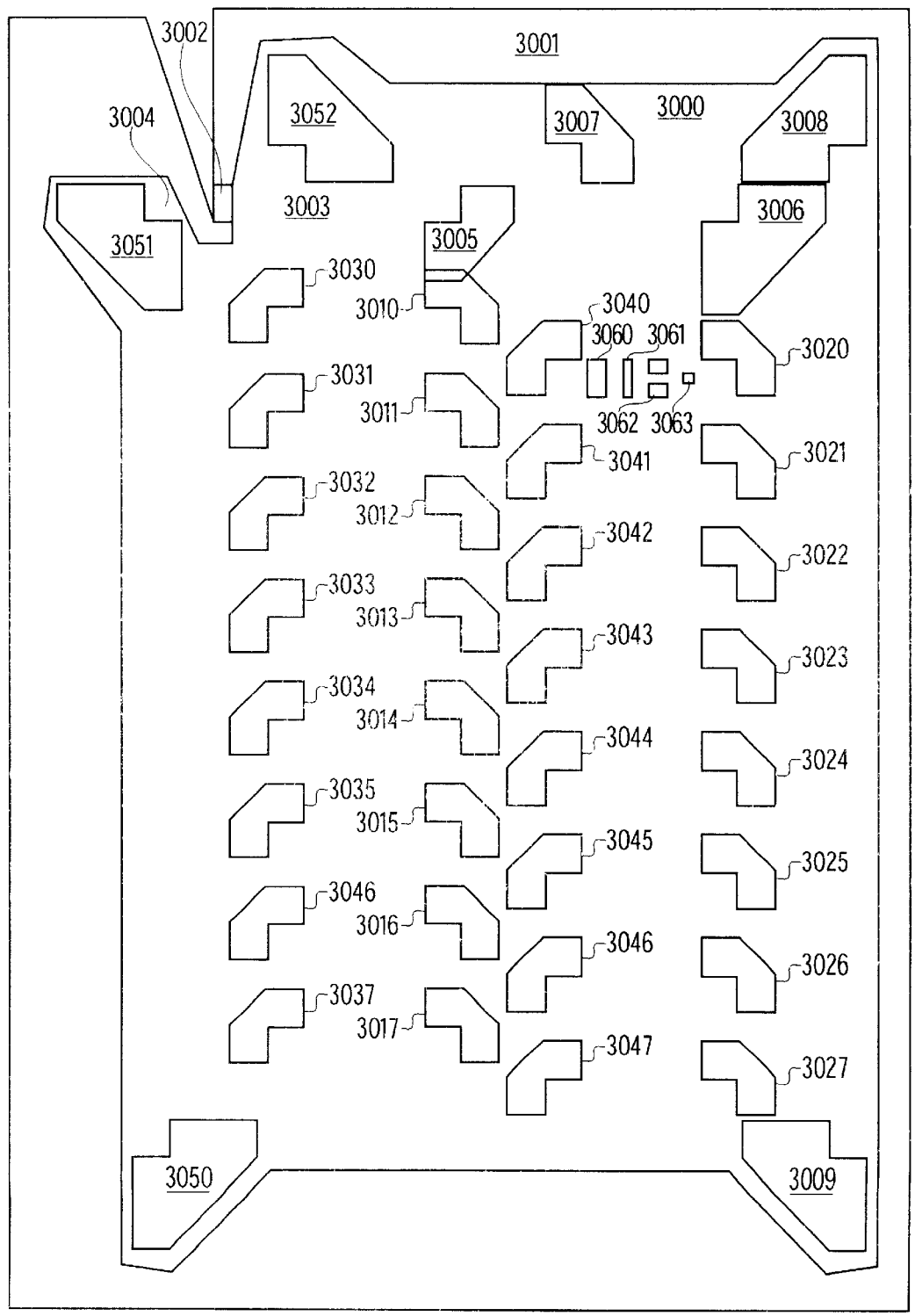

The embodiment shown in FIG. 30 is similar to the embodiment of FIG. 29. The antenna loop 3001 encircles the active region of the substrate 3000, with a transducer 3002 formed at a gap portion. The transducer 3002 has a forward 3003 and reverse 3004 acceptance path. The forward path intersects a low efficiency trackchanger 3005 and a high efficiency trackchanger 3006.

The low efficiency trackchanger 3005 redirects a portion of the acoustic wave energy downward, while the remainder passes through to the high efficiency trackchanger 3006, which redirects the remainder of the acoustic wave energy downward. These two downward paths are respectively displaced and non-overlapping. The downward path from the low efficiency trackchanger 3005 intersects a linearly disposed array of further trackchangers 3010, 3011, 3012, 3013, 3014, 3015, 3016, 3017, which are also low efficiency (except possibly the terminal trackchanger in the array). These redirected acoustic wave paths pass through wave modification structures, such as phase delay pads 3060, 3061 and/or phase/amplitude modification pads 3062, 3062, which are shown as exemplary elements. The waves are received by a linearly disposed array of low efficiency trackchangers 3030, 3031, 3032, 3033, 3034, 3035, 3036, 3037, which redirect the incident energy upward, toward the trackchanger 3052. Trackchanger 3052 redirects the acoustic energy from all of the trackchangers 3030, 3031, 3032, 3033, 3034, 3035, 3036, 3037 at right angles to the right, toward trackchanger 3008, which, in turn redirects the acoustic energy around the periphery of the substrate 3000 (within the antenna loop 3001) to trackchanger 3009, trackchanger 3050, trackchanger 3051, and hence to the rear of transducer 3002.

The high efficiency trackchanger 3006 redirects the acoustic wave energy downward to intersect a linearly disposed array of further trackchangers 3020, 3021, 3022, 3023, 3024, 3025, 3026, 3027, which are low efficiency (except possibly the terminal trackchanger in the array), which redirect respective portions of the acoustic wave at right angles, to the left. These redirected acoustic wave paths pass through wave modification structures, such as phase delay pads or phase/amplitude modification pads. The waves are received by a linearly disposed array of low efficiency trackchangers 3040, 3041, 3042, 3043, 3044, 3045, 3046, 3047, which redirect the incident energy upward, toward the trackchanger 3007. Trackchanger 3007 redirects the acoustic energy from all of the trackchangers 3040, 3041, 3042, 3043, 3044, 3045, 3046, 3047 at right angles to the right, toward trackchanger 3008, which, in turn redirects the acoustic energy around the periphery of the substrate 3000 (within the antenna loop 3001) to trackchanger 3009, trackchanger 3050, trackchanger 3051, and hence to the rear of transducer 3002.

The resulting die is about 3.73 mm×4.68 mm, having an area of about 17.5 mm². If the number of taps is reduced from eight (seven active plus one compensation) to seven (six active plus one compensation), the encoding capability drops from $16^{14}=2^{56}$, while the area required is reduced to 3.73 mm×3.94 mm, 14.85 mm²

EXAMPLE 11

Figure 31:
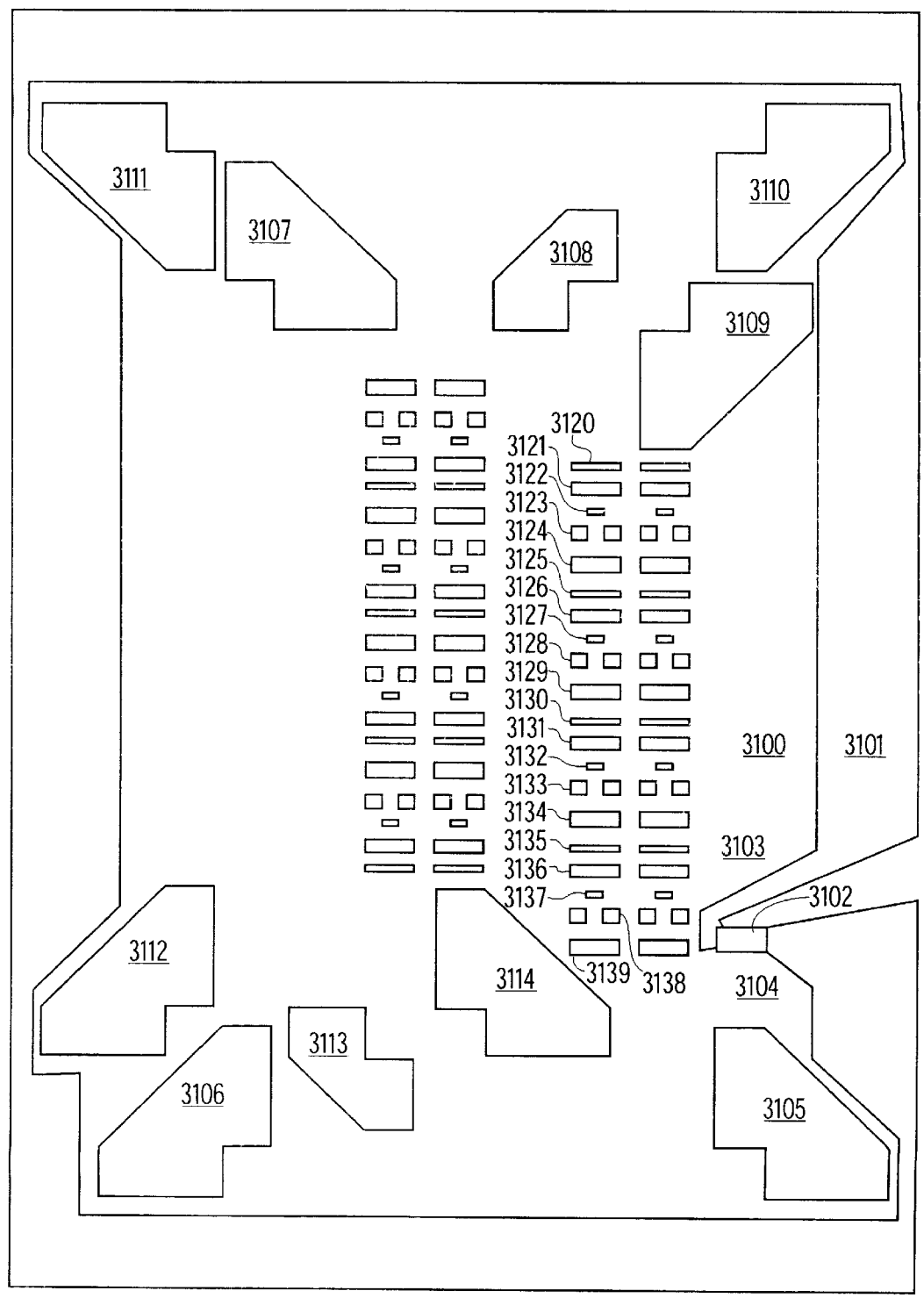
FIGS. 31, 32 and 33 show embodiments according to the present invention employing sequential QAM encoding of an acoustic wave.

The embodiment shown in FIG. 31 employs partially reflective elements between a series of "taps" (sets of encoding elements), and achieves QAM encoding. The antenna loop 3101 encircles the active region of the substrate 3100, with a transducer 3102 formed at a gap portion. The transducer 3102 has a forward 3104 and reverse 3103 acceptance path. The forward path intersects a high efficiency trackchanger 3105, while the reverse path intersects a high efficiency trackchanger 3110.

The trackchanger 3105 redirects the acoustic wave energy leftward, to trackchanger 3106, which further directs the energy to trackchanger 3107, then to low efficiency trackchanger 3108. Trackchanger 3108 directs the acoustic wave downward, toward sets of wave modification elements, to be discussed below. A portion of the acoustic wave passes through trackchanger 3108, to high efficiency trackchanger 3109, from which it is also redirected downward, toward sets of wave modification elements. The sets of wave modification elements include reflective elements, which return the acoustic wave along its incident path, back to the transducer 3102, through the forward path 3104.

The trackchanger 3110 redirects the acoustic wave energy leftward, to trackchanger 3111, which further directs the energy to trackchanger 3112, then to low efficiency trackchanger 3113. Trackchanger 3113 directs the acoustic wave upward, toward sets of wave modification elements, to be discussed below. A portion of the acoustic wave passes through trackchanger 3113, to high efficiency trackchanger 3114, from which it is also redirected upward, toward sets of wave modification elements. The sets of wave modification elements include reflective elements, which return the acoustic wave along its incident path, back to the transducer 3102, through the reverse path 3103.

As shown in FIG. 31, each of the sets of wave modification elements includes four delay pads and a partially reflective element (or, in the case of a terminal reflector, optionally a reflective element) which are selectively disposed on the substrate to impart a characteristic encoding pattern. The four delay pads include a π/4 delay pad 3120, 3125, 3130, 3135; a π/2 delay pad 3121, 3126, 3131, 3136; a π/4 delay pad, 3122, 3127, 3132, 3137, centrally located within the beam track and occupying about one third of the beam width; and a split π/2 delay pad, occupying about two thirds of the acoustic beam width 3123, 3128, 3133, 3138, After each set of QAM modulation clusters, a partially reflective element 3124, 3129, 3134, 3129 is formed to return portions of the acoustic wave to the transducer 3104 back along the incident path. The partially reflective element 3124, 3129, 3134, 3129, or other conductive full beam width element interposed in the beam path, such as a phase delay pad, serves as a structure for equalizing, i.e., making uniform, a phase delay of portions of said acoustic beam across the width of the acoustic beam. This equalizing element may be provided after passing the partial beam width elements and prior to interacting with a full beam width acousto-electric transducer.

The set of modulation elements thus provides four QAM-16 encoding sets for each of four acoustic paths, resulting in a theoretical capacity of 64 encoding bits.

The resulting die is about 2.82 mm×3.75 mm, having an area of about 10.6 mm$^2$. The encoding capability is 16 paths each with 8 level differential phase encoding, resulting in $8^{16}$ or 64 bits.

EXAMPLE 12

Figure 32:
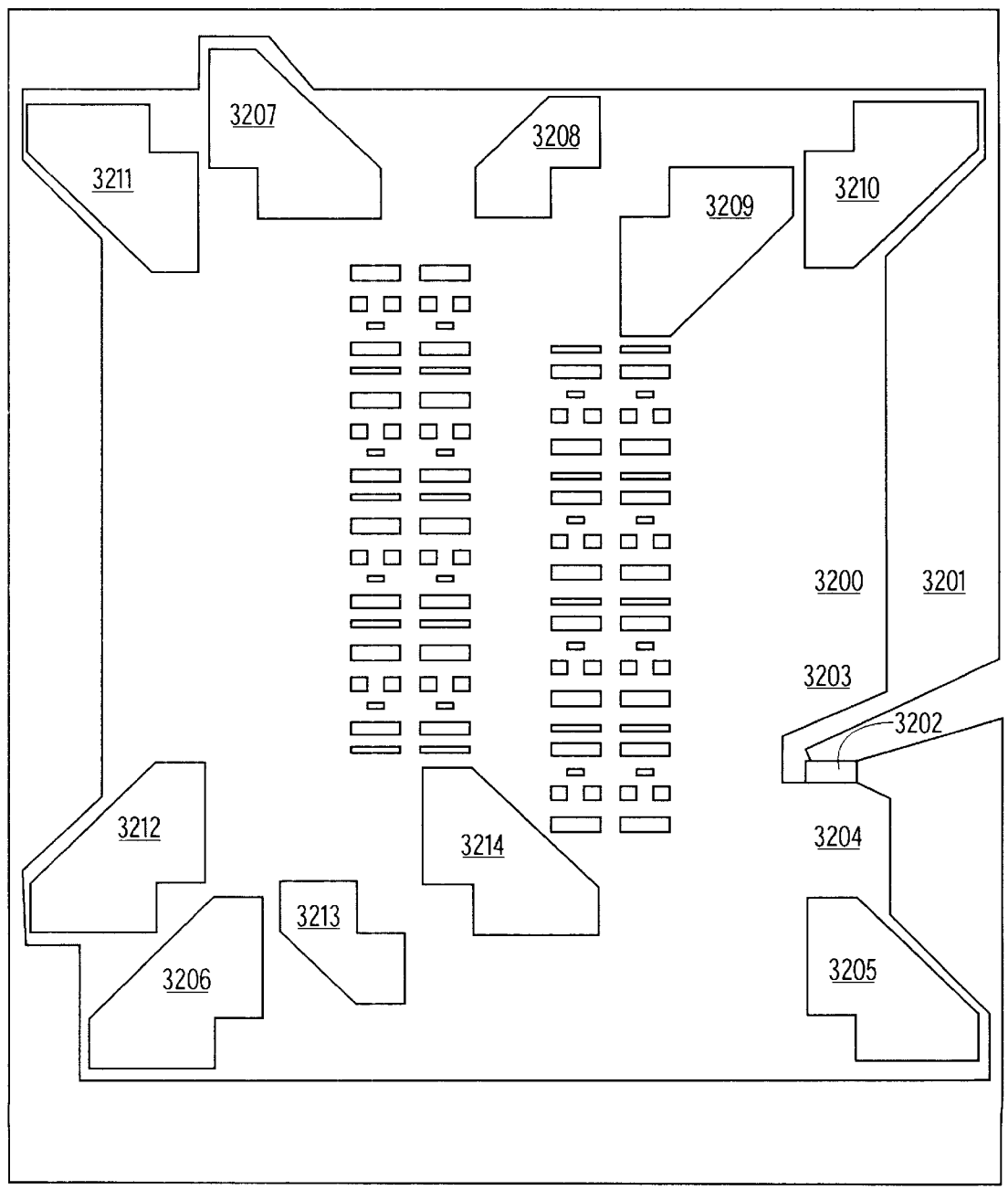

The embodiment shown in FIG. 32 is similar to the embodiment of FIG. 31, with a slightly different layout. The antenna loop 3201 encircles the active region of the substrate 3200, with a transducer 3202 formed at a gap portion. The transducer 3202 has a forward 3204 and reverse 3203 acceptance path. The forward path intersects a high efficiency trackchanger 3205, while the reverse path intersects a high efficiency trackchanger 3210.

The trackchanger 3205 redirects the acoustic wave energy leftward, to trackchanger 3206, which further directs the energy to trackchanger 3207, then to low efficiency trackchanger 3208. Trackchanger 3208 directs the acoustic wave downward, toward sets of wave modification elements, which are similar to the wave modification elements described in the embodiment of FIG. 31. A portion of the acoustic wave passes through trackchanger 3208, to high efficiency trackchanger 3209, from which it is also redirected downward, toward sets of wave modification elements. The trackchanger 3210 redirects the acoustic wave energy leftward, to trackchanger 3211, which further directs the energy to trackchanger 3212, then to low efficiency trackchanger 3213. Trackchanger 3213 directs the acoustic wave upward, toward sets of wave modification elements. A portion of the acoustic wave passes through trackchanger 3213, to high efficiency trackchanger 3214, from which it is also redirected upward, toward sets of wave modification elements.

The resulting die is about 3.22 mm×2.73 mm, having an area of about 8.79 mm$^2$. The encoding capability is 16 paths each with 8 level differential phase encoding, resulting in $8^{16}$ or 64 bits.

EXAMPLE 13

Figure 33:
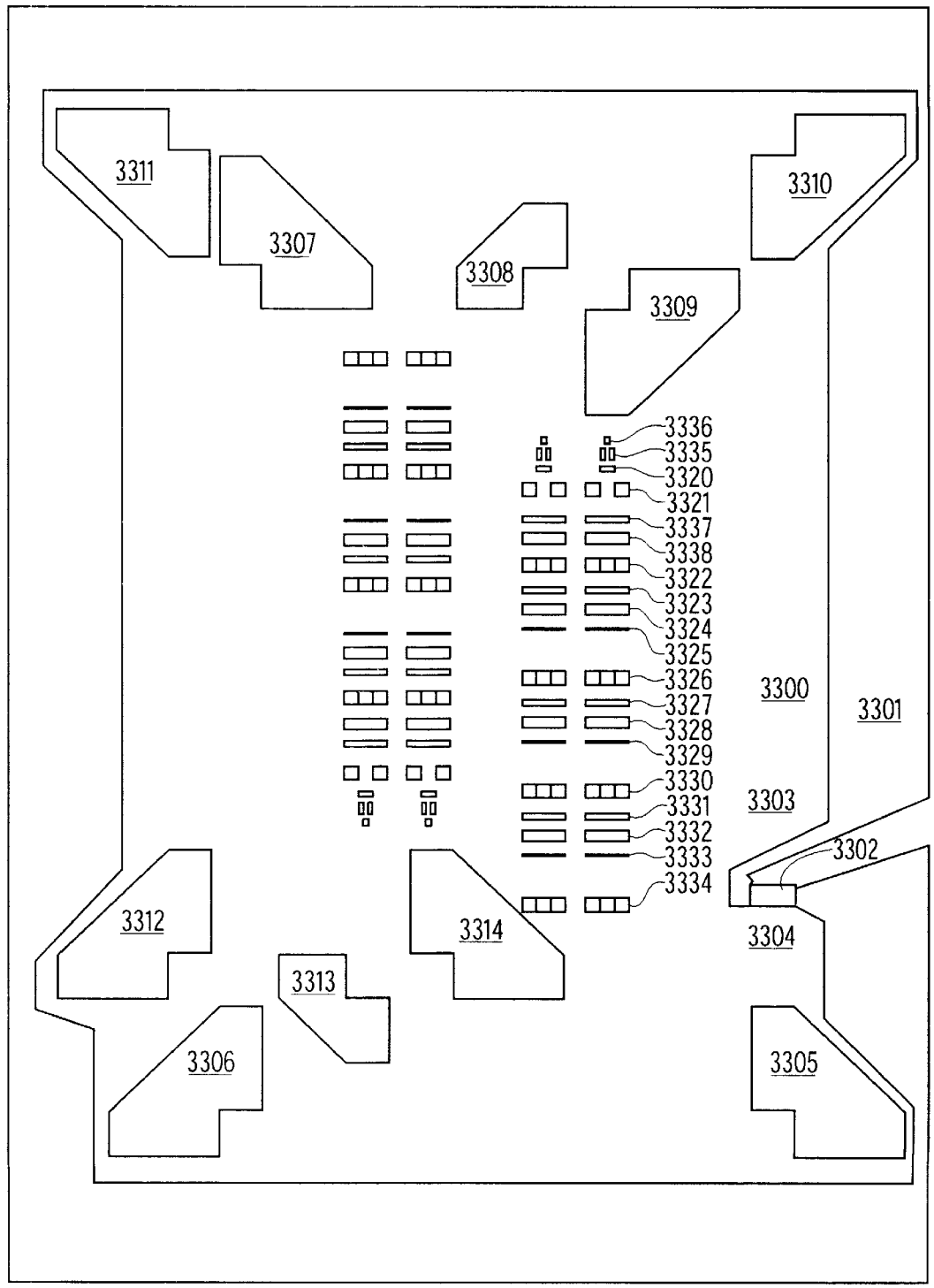

The embodiment shown in FIG. 33 is also similar to the embodiments of FIGS. 31 and 32, with slightly different layout. The antenna loop 3301 encircles the active region of the substrate 3300, with a transducer 3302 formed at a gap portion. The transducer 3302 has a forward 3304 and reverse 3303 acceptance path. The forward path intersects a high efficiency trackchanger 3305, while the reverse path intersects a high efficiency trackchanger 3310.

The trackchanger 3305 redirects the acoustic wave energy leftward, to trackchanger 3306, which further directs the energy to trackchanger 3307, then to low efficiency trackchanger 3308. Trackchanger 3308 directs the acoustic wave downward, toward sets of wave modification elements, which are described below. A portion of the acoustic wave passes through trackchanger 3308, to high efficiency trackchanger 3309, from which it is also redirected downward, toward sets of wave modification elements. The trackchanger 3310 redirects the acoustic wave energy leftward, to trackchanger 3311, which further directs the energy to trackchanger 3312, then to low efficiency trackchanger 3313. Trackchanger 3313 directs the acoustic wave upward, toward sets of wave modification elements. A portion of the acoustic wave passes through trackchanger 3313, to high efficiency trackchanger 3314, from which it is also redirected upward, toward sets of wave modification elements.

The wave modification elements, in this case, include, for each of the four wavepaths, a QAM-64 encoding structure 3336, 3335, 3320, 3321, 3337, 3338, followed by a semi-reflective structure 3322. Elements 3321 occupy two thirds of the beam width, with a characteristic phase delay of π/2. Element 3320 occupies one third of the beam width, with a characteristic phase delay of π/4. Elements 3335 occupy two ninths of the beam width, with a characteristic phase delay of π/2. Element 3326 occupies one ninth of the beam width, with a characteristic phase delay of π/4. Elements 33321, 33320, 3335, and 3336 are disposed symmetrically within the beam path.

Figures 35A, 35B:
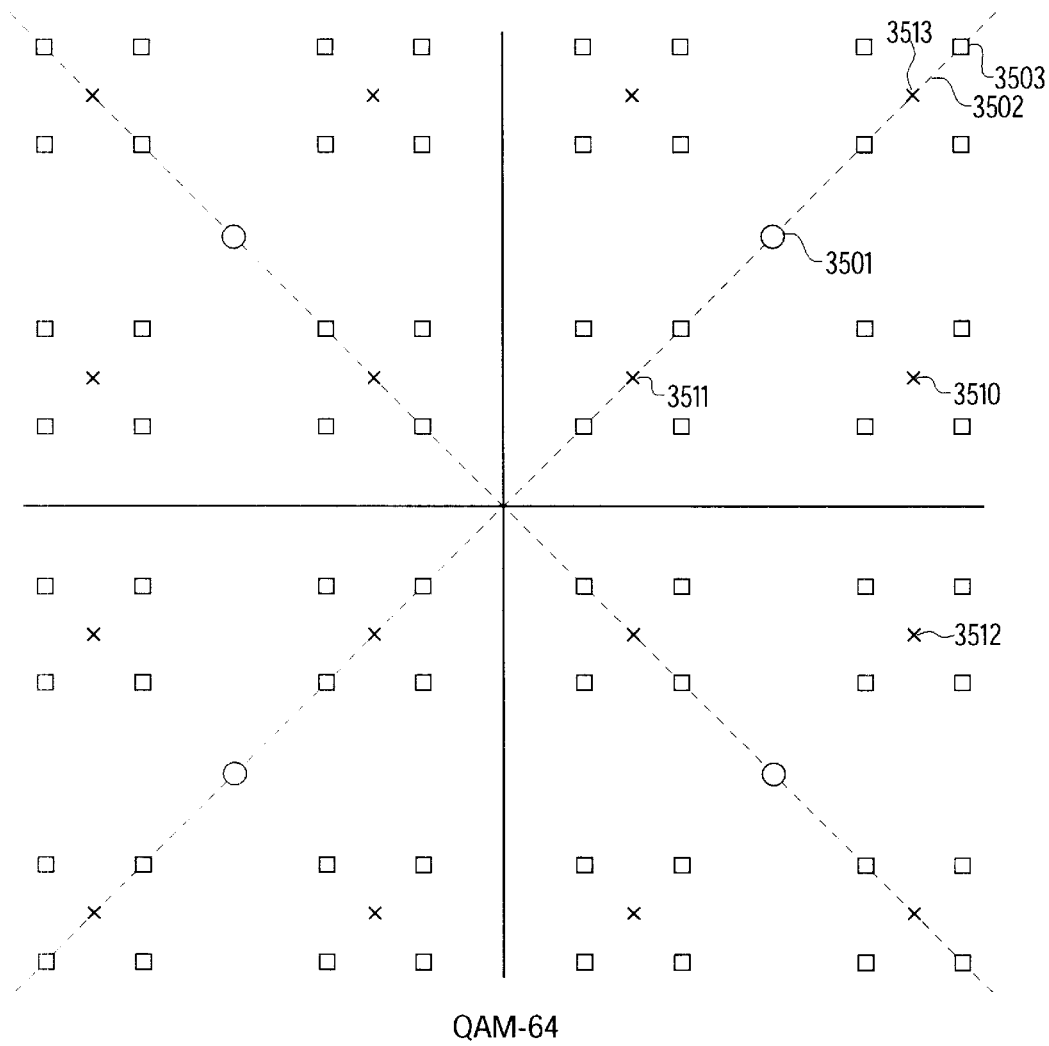
FIGS. 35A and 35B show a QAM(64) pattern and Phase and Phase Splitting Result, respectively.

As shown in FIG. 35A, a QAM modulation pattern provides a symmetric constellation of modulation states. Each state represents a splitting from a base state with four-fold symmetry. Thus, the state 3501 results from, for example, the four-fold phase splitting resulting from selective placement of π/2 and π/4 phase delay pads, effectively selecting a quadrant. The state 3502, which represents a QAM-16 pattern, results from the four-fold phase splitting within a selected quadrant. Thus, both phase and amplitude are altered, such as by the hereinbefore described triplets. Finally, the state 3503, which represents a QAM-64 pattern, results from the four-fold phase splitting of the QAM-16 constellation, such as by a triplet which occupies one third of the acoustic beam width.

FIGS. 35A and 35B show a phase angle alteration resulting from selective disposition of partial beam width phase delay pads. When no pads are present, state 3513 exists, and the acoustic beam is neither substantially phase shifted nor attenuated, thus representing a base or reference state. When the π/2 element is disposed within the beam width, for example two thirds of the beam, state 3511 exists, and the result is an attenuated beam with little relative phase shift. When the π/4 element alone is disposed within the beam width, state 3512 exists, and the result is both an attenuation and a phase shift. In this case, it is noted, the relative phase is actually shifted into a different quadrant. However, since this pattern is consistent for each quadrant, there is no ambiguity. When both the π/2 and π/4 elements are disposed within the beam width, state 3510 exists, and the wave is attenuated and phase shifted, as diagrammatically shown. Each state 3501 is thus subject to such splitting, filling out a complete constellation in all four quadrants. Likewise, each state 3502 of a QAM-16 constellation is subject to such splitting, as well to produce the QAM-64 constellation states 3503.

The QAM-64 encoding structure is followed by three successive sets of phase encoding structures, each having a $\pi/8$ encoding element 3325, 3329, 3333, a $\pi/4$ encoding element 3323, 3327, 3331 and a $\pi/2$ encoding element 3324, 3328, 3332. Partially reflective structures 3326, 3330, 3334 are provided after each set of encoding elements. The resulting die is about 3.6 mm×2.5 mm, having an area of about 9.0 mm². The encoding capability is four paths with QAM-64 encoding, and 12 paths with 8 level differential phase encoding, resulting in about 60 bits of encoding space.

EXAMPLE 14

Figure 34:
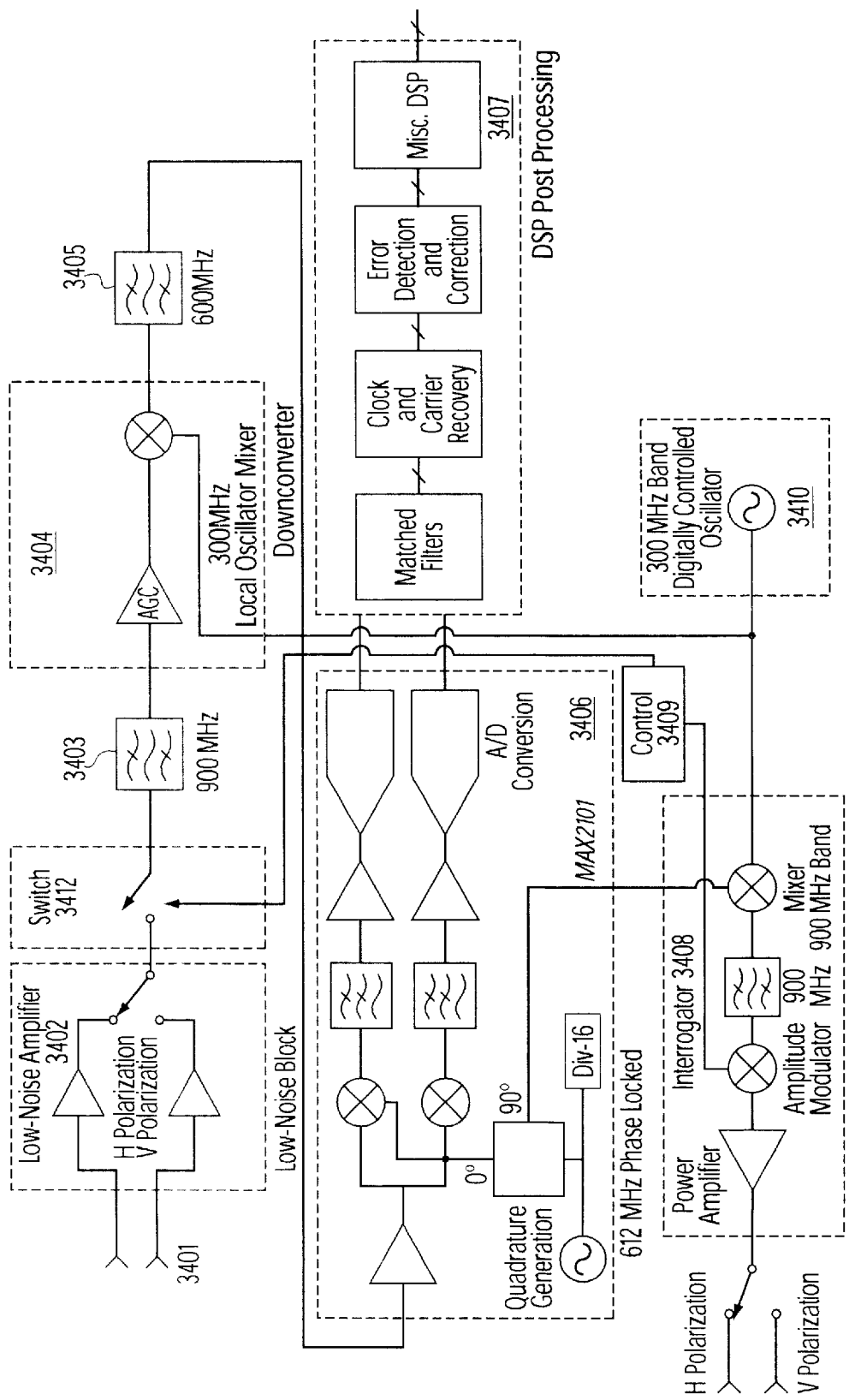
FIG. 34 shows a circuit diagram.

A decoder for phase-amplitude modulated signals is provided as follows. FIG. 34 shows an embodiment employing a Maxim MAX2101 RF-to-bits® converter. Since this device has a maximum frequency of operation of 700 MHz, the incoming signal must be downconverted. Thus, a set of horizontally and vertically polarized antennas 3401 receives the backscatter signal. Low noise amplifier 3402 (actually, a pair of amplifiers, one for each of the horizontally and vertically polarized signals) amplifies the received signal, which is then filtered in the 900 MHz band by filter 3403. Downconverter 3404 drops the frequency into the 600 MHz band, using a signal generated by a frequency agile, digitally controlled oscillator 3410, which generates a 300 MHz band signal. The downconverted signal is then narrow band filtered by filter 3405. This filtered signal is then converted to I and Q digitized signals by converter 3406. By employing both I and Q phases, the receiver has an effectively increased gain of 3 dB over a single phase receiver. The converter 3406 includes a phase locked oscillator operating at about 612 MHz, which effectively downconverts the filtered signal 600 MHz band signal to baseband. The digitized signal is then processed by a digital signal processor (DSP) 3407, for example to digitally filter the signal, recover the "carrier" and tap timing components, optionally detect errors and attempt remediation, and ultimately define the encoding of the transponder.

The interrogator 3408 synthesizes an interrogation pulse corresponding to the downconversion scheme, i.e., employing the same oscillators, to allow coherent detection. In this case, the digitally controlled oscillator 3410 is mixed with the 612 MHz oscillator of the converter 3406, and the resulting 900 MHz band signal filtered. As shown in FIG. 34, an amplitude modulator (AM), controlled by control 3409, modulates the filtered output signal. The modulation of this signal may be near complete, i.e., a full attenuation of the signal, or any lesser degree. The control 3410 also controls an input switch, which allows the sensitive receive electronics to be decoupled when the interrogator 3408 is active, preventing saturation of filters and the like.

The amplitude modulator is not required in all embodiments, and indeed is preferred for multimode compatible interrogation systems, such as an interrogator capable of reading both passive and active transponder devices. Active transponders typically detect a pulse carrier wave which signals the device to become operative, from a sleep mode. The amplitude modulator thus facilitates pulsing the carrier. This amplitude modulator also allows intermittent excitation of an acoustic wave transponder. In the case of a staircase chirp excitation interrogation waveform, the switch 3412, amplitude modulator and control 3409 are not required.

Also shown are horizontally and vertically polarized antennas for both the transmitter and receiver. Typically, these operate sequentially, with the polarization with the higher quality received signal employed for analysis by the DSP 3407.

It is also noted that the DSP 3407 may encompass substantial signal processing functionality, as is known in the arts, and the functionality indicated in FIG. 34 is meant to be exemplary and not limiting of the types of DSP algorithms which may be applied.

The MAX2101 operates with a 400–700 MHz band signal, with six bit I/Q direct to digital conversion digitized at 60 megasamples per second (for each channel), allowing a 30 MHz detection bandwidth. When such a device is employed to demodulate the received signal according to the present invention, an AGC is used to normalize the signal amplitude from a receiving antenna amplifier and bandpass filter. The digitized demodulated signal is represented as a pair of quadrature signals, I and Q, each of which represents an approximately 15 MHz band-limited representation of the received signal. Therefore, information which has a pertinent timescale of greater than about 60 nS will be represented in the digitized signal. Practically, transponders may be provided having relative spacing of events of greater than 100 nS, making such parts suitable for use. Therefore, the relative amplitude of a concurrent I and Q signal will represent a phase angle, while relative amplitudes may be calculated based on a sequence of received data points.

Of course, it is possible to build such a module with lower integration parts, such as the Maxim MAX 2102/2105/2107 Direct-Conversion Tuner IC, which allows direct to baseband quadrature conversion with an external analog to digital converter, e.g., MAX1002/1003 Dual ADC for digitization, of a 900 MHz band signal. Thus, in a lower integration parts environment, the downconverter 3404 may be dispensed with, with the filter 3405 tuned to the 900 MHz band signal of interest. In this case, either the digitally controlled oscillator 3410 operates in the 900 MHz band directly, or the 900 MHz signal is synthesized from other frequencies. Further, it is noted that the 900 MHz band signal may be generated by mixing any two or more signals, including, e.g., harmonic generation from a 450 MHz band signal, two higher frequency signals which have a respective difference in frequency of 900 MHz, or the like. It is important for many embodiments that the interrogation signal correspond closely with the demodulation signal, allowing coherent detection of the backscatter signal.

There has thus been shown and described a novel acoustic transponder substrate, and an RF-ID transponder produced with such a substrate, which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method of modulating an acoustic beam having a beamwidth, comprising the steps of selectively providing, along a path of the acoustic beam, one or more non-transducing elements which impose a phase delay on the acoustic wave, wherein at least a portion of elements are disposed over only a portion of the beamwidth, resulting in phase interference modulation of the acoustic beam.

2. The method according to claim 1, wherein said one or more elements comprises a set of members disposed bilaterally symmetrical with respect to an axis of acoustic beam propagation.

3. The method according to claim 1, wherein at least a subset of said elements modulate the acoustic beam in a QAM constellation pattern, wherein said QAM constellation pattern has about $2^n$ states, and wherein n is an integer greater than or equal to 2.

4. The method according to claim 1, further comprising the step of equalizing a phase delay of portions of said acoustic beam across the width of the acoustic beam after passing said elements and prior to any transducing of the entire acoustic wave into an electrical signal.

5. The method according to claim 1, further comprising the step of splitting the acoustic beam after passing said elements and subjecting a portion of said split beam to a further set of elements for modulating said acoustic beam.

6. The method according to claim 5, wherein said further set of elements includes structures or equalizing a relative phase delay across the beamwidth and imposing a further net phase delay to at least a portion of the acoustic wave.

7. A method of modulating an acoustic wave, comprising generating an acoustic wave on a substrate, said acoustic wave propagating along a propagation axis and having a beam width along an axis perpendicular to the propagation axis, providing a phase delay pad disposed along the propagation axis within the beam width, occupying less than the entire beam width; summing the acoustic power of the acoustic beam after interaction with the phase delay pad; and outputting the summed acoustic power.

8. The method according to claim 7, further comprising the steps of, before said summing step, splitting the energy of the acoustic beam, equalizing a phase delay of respective portions of the beam width, providing an additional phase delay pad disposed along the propagation axis within the equalized beam width, occupying less than the entire equalized beam width; and summing the acoustic power of the equalized acoustic beam after interaction with the additional phase delay pad, said outputting the summed acoustic power step comprising outputting a split portion of the acoustic beam and outputting the summed acoustic power of the equalized acoustic beam.

9. A device for modulating an acoustic beam having a beamwidth, comprising: one or more non-transducing elements disposed along a predetermined path of an acoustic beam on a substrate, said elements being adapted for imposing a phase delay on the acoustic wave, wherein at least a portion of said elements are disposed over only a portion of the beamwidth, resulting in phase interference modulation of the acoustic beam.

10. The device according to claim 9, wherein said element comprises a set of members disposed symmetrical with respect to an axis of acoustic beam propagation.

11. The device according to claim 9, wherein at least a subset of said elements are adapted to modulate the acoustic beam in a QAM-16 constellation pattern.

12. The device according to claim 9, further comprising a structure for equalizing a phase delay of portions of said acoustic beam across the width of the acoustic beam after passing said elements and prior to interacting with a full beam width acousto-electric transducer.

13. The device according to claim 9, further comprising a splitter for splitting the acoustic beam, disposed past said elements along an acoustic beam propagation path, and a further set of elements for modulating said acoustic beam disposed to interact with a split portion of the acoustic beam.

14. The device according to claim 9, wherein said further set of elements includes structures or equalizing a relative phase delay across the beamwidth and imposing a further net phase delay to at least a portion of the acoustic wave.

15. A device for modulating an acoustic wave, comprising an electroacoustic transducer for generating an acoustic wave on a substrate, said acoustic wave propagating along a propagation axis and having a beam width along an axis perpendicular to the propagation axis, a phase delay pad disposed along the propagation axis within the beam width, occupying less than the entire beam width; and a summer for summing the acoustic power of the acoustic beam after interaction with the phase delay pad.

16. The device according to claim 15, further comprising a splitter, disposed before said summer, adapted for splitting the energy of the acoustic beam; a phase delay equalizer for equalizing a phase delay of respective portions of the beam width; an additional phase delay pad disposed along the propagation axis within the equalized beam width, occupying less than the entire equalized beam width; and a further summer for summing the acoustic power of the equalized acoustic beam after interaction with the additional phase delay pad.

17. The device according to claim 9, wherein at least a subset of said elements are adapted to modulate the acoustic beam in a QAM constellation pattern having about $2^n$ evenly spaced signal states in said QAM constellation, wherein n is an integer greater than 1.

18. A method of modulating an acoustic beam having a beamwidth, comprising the steps of selectively providing, along a path of the acoustic beam, one or more elements which impose a phase delay on the acoustic wave, wherein at least a portion of elements are disposed over only a portion of the beamwidth, wherein at least a subset of said elements modulate the acoustic beam in a QAM constellation pattern, wherein said QAM constellation pattern has about $2^n$ states, and wherein n is an integer greater than or equal to 2.

19. A method of modulating an acoustic beam having a beamwidth, comprising the steps of selectively providing, along a path of the acoustic beam, one or more elements which impose a phase delay on the acoustic wave, wherein at least a portion of elements are disposed over only a portion of the beamwidth, and equalizing a phase delay of portions of said acoustic beam across the width of the acoustic beam after passing said elements and prior to any transducing of the entire acoustic wave into an electrical signal.

20. A method of modulating an acoustic beam having a beamwidth, comprising the steps of selectively providing, along a path of the acoustic beam, one or more elements which impose a phase delay on the acoustic wave, wherein at least a portion of elements are disposed over only a portion of the beamwidth, and splitting the acoustic beam after passing said elements and subjecting a portion of said split beam to a further set of elements for modulating said acoustic beam.

21. A device for modulating an acoustic beam having a beamwidth, comprising: one or more elements disposed along a predetermined path of an acoustic beam on a substrate, said elements being adapted for imposing a phase delay on the acoustic wave, wherein at least a portion of said elements are disposed over only a portion of the beamwidth, wherein at least a subset of said elements are adapted to modulate the acoustic beam in a QAM constellation pattern having about $2^n$ evenly spaced signal states in said QAM constellation, wherein n is an integer greater than 1.

22. The device according to claim 21, wherein at least a subset of said elements are adapted to modulate the acoustic beam in a QAM-16 constellation pattern.

23. A device for modulating an acoustic beam having a beamwidth, comprising: one or more elements disposed along a predetermined path of an acoustic beam on a substrate, said elements being adapted for imposing a phase delay on the acoustic wave, wherein at least a portion of said elements are disposed over only a portion of the beamwidth, and a structure for equalizing a phase delay of portions of said acoustic beam across the width of the acoustic beam after passing said elements and prior to interacting with a full beam width acousto-electric transducer.

24. A device for modulating an acoustic beam having a beamwidth, comprising: one or more elements disposed along a predetermined path of an acoustic beam on a substrate, said elements being adapted for imposing a phase delay on the acoustic wave, wherein at least a portion of said elements are disposed over only a portion of the beamwidth, and a splitter for splitting the acoustic beam, disposed past said elements along an acoustic beam propagation path, and a further set of elements for modulating said acoustic beam disposed to interact with a split portion of the acoustic beam.

* * * * *